(12) United States Patent
Van Den Broeke et al.

(10) Patent No.: US 7,026,081 B2
(45) Date of Patent: Apr. 11, 2006

(54) OPTICAL PROXIMITY CORRECTION METHOD UTILIZING PHASE-EDGES AS SUB-RESOLUTION ASSIST FEATURES

(75) Inventors: Douglas Van Den Broeke, Sunnyvale, CA (US); J. Fung Chen, Cupertino, CA (US)

(73) Assignee: ASML Masktools B.V., Veldhoven (NL)

( * ) Notice: Subject to any disclaimer, the term of this patent is extended or adjusted under 35 U.S.C. 154(b) by 215 days.

(21) Appl. No.: 10/152,686

(22) Filed: May 23, 2002

(65) Prior Publication Data

US 2003/0064298 A1 Apr. 3, 2003

Related U.S. Application Data

(60) Provisional application No. 60/325,211, filed on Sep. 28, 2001.

(51) Int. Cl.
 *G03F 9/00* (2006.01)
 *G03C 5/00* (2006.01)

(52) U.S. Cl. .............................. 430/30; 430/5; 430/311; 430/396

(58) Field of Classification Search .................... 430/5, 430/396, 313, 311, 312, 30
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,302,477 A | 4/1994 | Dao et al. | |
| 5,523,193 A | 6/1996 | Nelson | |
| 5,807,649 A | * 9/1998 | Liebmann et al. .............. | 430/5 |
| 5,821,014 A | 10/1998 | Chen et al. | |

(Continued)

FOREIGN PATENT DOCUMENTS

| | | |
|---|---|---|
| JP | 7-152144 | 6/1995 |
| JP | 9-127676 | 5/1997 |
| JP | 9-152708 | 6/1997 |
| JP | 10-326005 | 12/1998 |
| JP | 2000-214572 | 8/2000 |
| WO | WO 98/40791 | 9/1998 |

OTHER PUBLICATIONS

Copy of: Japanese Official Action dated Jul. 16, 2004 (Appln. No. 2002-320524) and EPO Official Action dated Jul. 10, 2003 (Appln. No. 02256694.7-1231-).
Schellenberg et al., "Optimization of Real Phase Mask Performance", SPIE vol. 1604, 11th Annual BACUS symposium on Photomask Technology (1991), pp. 274–296.
Lin, "Phase–Shifting Masks Gain an Edge", IEEE Circuits and Devices Magazine, vol. 9, No. 2, Mar. 1993, pp. 28–35.
T. Terasawa, et al., "Improved Resolution of an i–Line Stepper Using a Phase–Shifting Mask", J. Vac. Sci, Technol, B, vol. 8, No. 6, 1990, pp. 1300–1308.
Watanabe, H. et al., Transparent phase shifting mask, Electron Devices Meeting, 1990. Technical Digest., International, San Francisco, CA, USA, pp. 821–824, Dec. 1990.
Watanabe, H. et al., Sub–quarter–micron gate pattern fabrication using a transparent phase shifting mask, 1991, J. Vac. Sci. Technol. B, vol. 9, No. 6, pp. 3172–3175, Nov./Dec. 1991.

(Continued)

*Primary Examiner*—Mark F. Huff
*Assistant Examiner*—Saleha Mohamedulla
(74) *Attorney, Agent, or Firm*—McDermott Will & Emery LLP

(57) ABSTRACT

A photolithography mask for optically transferring a pattern formed in the mask onto a substrate and for negating optical proximity effects. The mask includes a plurality of resolvable features to be printed on the substrate, and at least one non-resolvable optical proximity correction feature, where the non-resolvable optical proximity correction feature is a phase-edge.

18 Claims, 23 Drawing Sheets

U.S. PATENT DOCUMENTS

| | | | |
|---|---|---|---|
| 5,827,625 | A | 10/1998 | Lucas et al. |
| 5,969,441 | A | 10/1999 | Loopstra et al. |
| 6,046,792 | A | 4/2000 | Van Der Werf et al. |
| 6,482,555 | B1 | 11/2002 | Chen et al. |
| 6,541,167 | B1 | 4/2003 | Petersen et al. |
| 6,623,895 | B1 | 9/2003 | Chen et al. |

OTHER PUBLICATIONS

Levenson, Marc D., SCAA mask exposures and Phase Phirst design for 110nm and below, Proceedings of SPIE, vol. 4346 (2001), pp. 817–828.

Toh, Kenny K.H., et al., Optical Lithography with Chromeless Phase–Shifted Masks, SPIE vol. 1463, Optical/Laser Microlithography IV (1991), pp. 74–85.

Levenson, Marc D. et al., Improving Resolution in Photolithography with a Phase–Shifting Mask, IEEE Transactions on Electron Devices, vol. ED–29, No. 12, pp. 1828–1836, Dec. 1982.

Erdélyi, Miklós, Enhanced Microlithography Using Combined Phase Shifting and Off–axis Illumination, Jpn. J. Appl. Phys., vol. 34 (1995), Pt. 2, No. 12A, pp. 1629–1631.

Matsuo, Takahiro et al., Feasibility Study of an Embedded Transparent Phase–Shifting Mask in ArF Lithography, Optical Microlithography XIII, Proceedings of SPIE, vol. 4000 (2000). pp. 443–451.

Schellenberg F. et al., "Optimization of Real Phase Mask Performance" 11th Annual Symposium on Photomask Technology, Sunnyvale, CA USA, Sep. 25–27, 1604 (1991).

Lin B. J., "Phase–Shifting Masks Gain an Edge", IEEE Circuits and Devices Magazine, IEEE Inc. New York, US, vol. 9 No. 2, Mar. 1, 1993, pp. 28–35.

T. Terasawa, N. Hasegawa, T. Tanaka, S. Katagiri, "Improved Resolution of an I–Line Stepper Using a Phase–Shifting Mask", J. Vac. Sci. Technol. B, vol. 8, No. 6, 1990.

* cited by examiner

OPTICAL PROXIMITY CORRECTION METHOD UTILIZING PHASE-EDGES AS SUB-RESOLUTION ASSIST FEATURES

RELATED APPLICATIONS

This application is claims priority from U.S. Provisional Patent Application No. 60/325,211, filed Sep. 28, 2001.

FIELD OF THE INVENTION

The present invention relates to photolithography, and in particular to the design and generation of a photomask ("mask") having sub-resolution optical proximity correction ("OPC") features, which function to correct for optical proximity effects. The present invention also relates to the use of such a mask in a lithographic projection apparatus, which generally comprises:

a radiation system for supplying a projection beam of radiation;

a support structure for supporting patterning means (e.g., mask), the patterning means serving to pattern the projection beam according to a desired pattern;

a substrate table for holding a substrate; and a projection system for projecting the patterned beam onto a target portion of the substrate.

BACKGROUND OF THE INVENTION

Lithographic apparatus can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or the smallest space between two lines. Thus, the CD determines the overall size and density of the designed circuit.

Of course, one of the goals in integrated circuit fabrication is to faithfully reproduce the original circuit design on the wafer (via the mask). Another goal is to use as much of the semiconductor wafer real estate as possible. As the size of an integrated circuit is reduced and its density increases, however, the CD of its corresponding mask pattern approaches the resolution limit of the optical exposure tool. The resolution for an exposure tool is defined as the minimum feature that the exposure tool can repeatedly expose on the wafer. The resolution value of present exposure equipment often constrains the CD for many advanced IC circuit designs.

As the critical dimensions of the circuit layout become smaller and approach the resolution value of the exposure tool, the correspondence between the mask pattern and the actual circuit pattern developed on the photoresist layer can be significantly reduced. The degree and amount of differences in the mask and actual circuit patterns depends on the proximity of the circuit features to one another. Accordingly, pattern transference problems are referred to as "proximity effects."

To help overcome the significant problem of proximity effects, a number of techniques are used to add sub-lithographic features to mask patterns. Sub-lithographic features have dimensions less than the resolution of the exposure tool, and therefore do not transfer to the photoresist layer. Instead, sub-lithographic features interact with the original mask pattern and compensate for proximity effects, thereby improving the final transferred circuit pattern.

Examples of such sub-lithographic features are scattering bars and anti-scattering bars, such as disclosed in U.S. Pat. No. 5,821,014 (incorporated herein by reference), which are added to mask patterns to reduce differences between features within a mask pattern caused by proximity effects. More specifically, sub-resolution assist features, or scattering bars, have been used as a means to correct for optical proximity effects and have been shown to be effective for increasing the overall process window (i.e., the ability to consistently print features having a specified CD regardless of whether or not the features are isolated or densely packed relative to adjacent features). As set forth in the '014 patent, generally speaking, the optical proximity correction occurs by improving the depth of focus for the less dense to isolated features by placing scattering bars near these features. The scattering bars function to change the effective pattern density (of the isolated or less dense features) to be more dense, thereby negating the undesirable proximity effects associated with printing of isolated or less dense features. It is important, however, that the scattering bars themselves do not print on the wafer. Thus, this requires that the size of the scattering bars must be maintained below the resolution capability of the imaging system.

Accordingly, as the limits of optical lithography are being enhanced far into the sub-wavelength capability, assist features, such as scattering bars, must be made smaller and smaller so that the assist features remain below the resolution capability of the imaging system. However, as imaging systems move to smaller wavelengths and higher numerical apertures, the ability to manufacture the photomasks with sub-resolution scattering bars sufficiently small becomes a critical issue and a serious problem.

Furthermore, as the resolution capability increases, the minimum distance (i.e., pitch) between features also decreases. This reduction in pitch makes it increasingly difficult to generate photomasks having sub-resolution assist features disposed between such closely spaced features. In other words, if features are too close together, it can be exceedingly difficult (or even impossible) to create a sub-resolution assist feature, such as a scattering bar, between such features.

Thus, there exists a need for a method of providing assist features in a photomask which eliminates the foregoing problems associated with generating the minute geometries that are necessary for assist features to remain below the resolution capability of current imaging systems.

SUMMARY OF THE INVENTION

In an effort to solve the aforementioned needs, it is an object of the present invention to provide sub-resolution assist features which are "dimension-less" (as opposed to scattering bars which have a defined width and which must be formed as a feature in the photomask) so as to eliminate the foregoing problems associated with creating sub-resolution assist features in a photomask when utilizing high resolution imaging systems. In accordance with the present invention, as explained in detail below, "dimension-less" phase-edges are utilized as sub-resolution assist features.

More specifically, the present invention relates to a photolithography mask for optically transferring a pattern formed in the mask onto a substrate. The mask includes a plurality of resolvable features to be printed on the substrate, and at least one non-resolvable optical proximity correction feature, where the non-resolvable optical proximity correction feature is a phase-edge.

The present invention also relates to a method of transferring a lithographic pattern from a photolithography mask onto a substrate by use of a lithographic exposure apparatus. The method includes the steps of forming a plurality of resolvable features to be printed on the substrate, and forming at least one non-resolvable optical proximity correction feature which is a phase-edge.

As described in further detail below, the present invention provides significant advantages over the prior art. Most importantly, as the phase-edges are essentially dimension-less in that there is no width dimension (or CD) associated with a phase-edge, the use of the phase-edge eliminates the need to be able to create an exceedingly small feature (i.e., scattering bar) on the mask. Moreover, the phase-edges can be readily placed between features regardless of the pitch between the features. Thus, by utilizing phase-edges as OPC features, it is possible to provide OPC in certain mask environments that can not accommodate known OPC techniques, such as scattering bars.

Additional advantages of the present invention will become apparent to those skilled in the art from the following detailed description of exemplary embodiments of the present invention.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. No. 5,296,891 and U.S. Pat. No. 5,523,193, which are incorporated herein by reference.

a programmable LCD array. An example of such a construction is given in U.S. Pat. No. 5,229,872, which is incorporated herein by reference.

The invention itself, together with further objects and advantages, can be better understood by reference to the following detailed description and the accompanying schematic drawings.

DETAILED DESCRIPTION OF THE INVENTION

Figure 1:
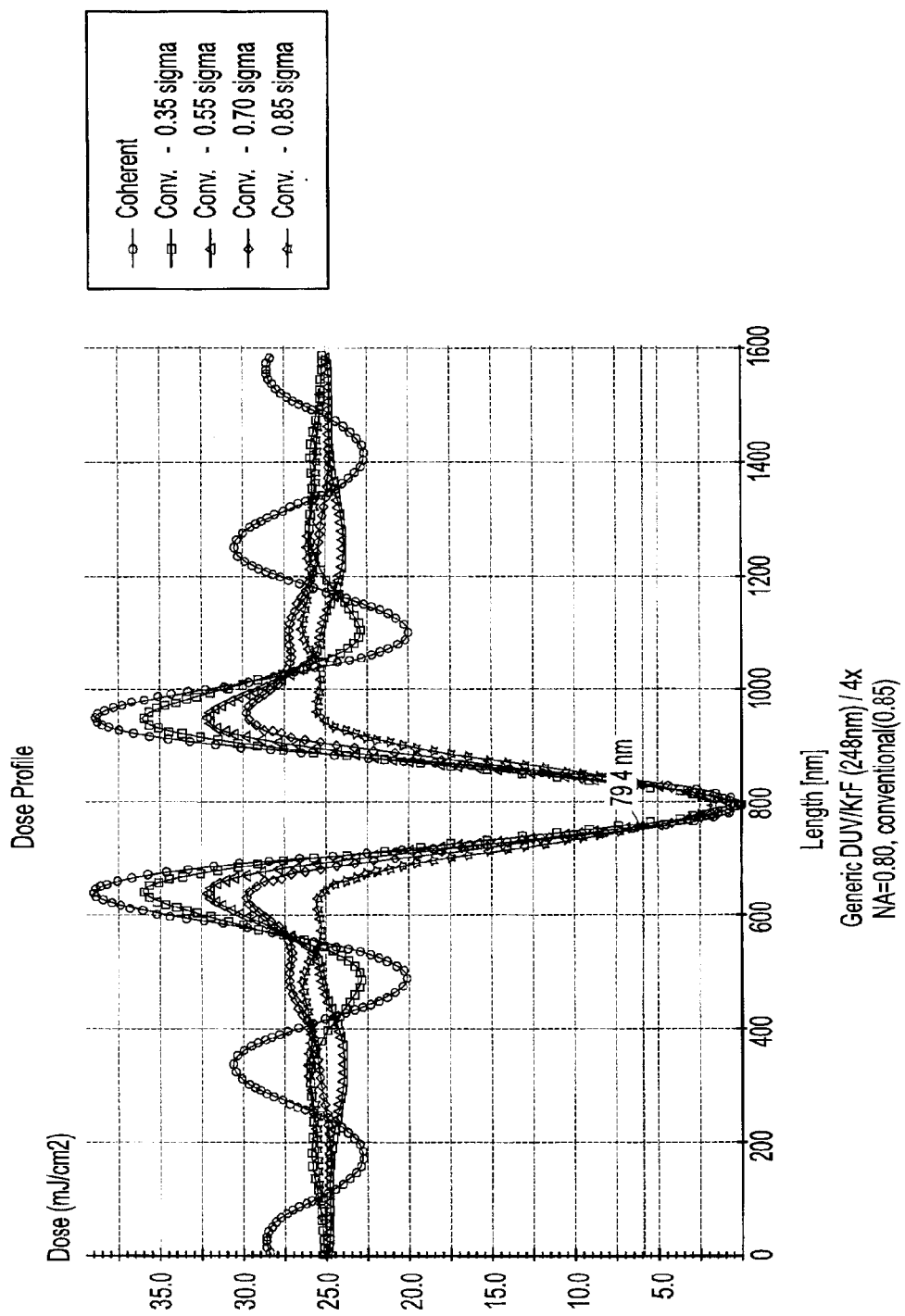
FIG. 1 is an exemplary aerial intensity profile of a 180° phase-edge utilizing conventional illumination and varying sigma (σ).

In accordance with the optical proximity correction technique of the present invention, non-resolvable phase-edges are utilized as sub-resolution assist features. Prior to the present invention, phase-edges have typically been used to print very small features using a highly coherent exposure wavelength. This is possible because theoretically, a 180° phase-edge will provide an aerial image that has an $I_{min}$ (i.e., minimum light intensity) equal to zero and an infinite contrast when the phase-edge is illuminated with highly coherent light. This very strong dark image contrast only occurs when the illumination is highly coherent and it allows for overexposing the wafer to print very small dark features. As the illumination becomes less coherent, as in the case of increasing sigma (σ) with conventional illumination, the contrast of the phase-edge aerial image is reduced and $I_{min}$ increases so that it is no longer zero. The foregoing is illustrated in FIG. 1. As shown therein, for each increase in σ, the value of $I_{min}$ increases. However, it is noted that for each of the five examples set forth in FIG. 1, the phase-edge is printed on the wafer as the value of $I_{min}$ is below the printing threshold (which is process dependent) defined by the dotted horizontal line illustrated in FIG. 1. It is also noted that the location of the phase-edge is 800 nm as defined by the horizontal axis of FIG. 1.

Figure 2:
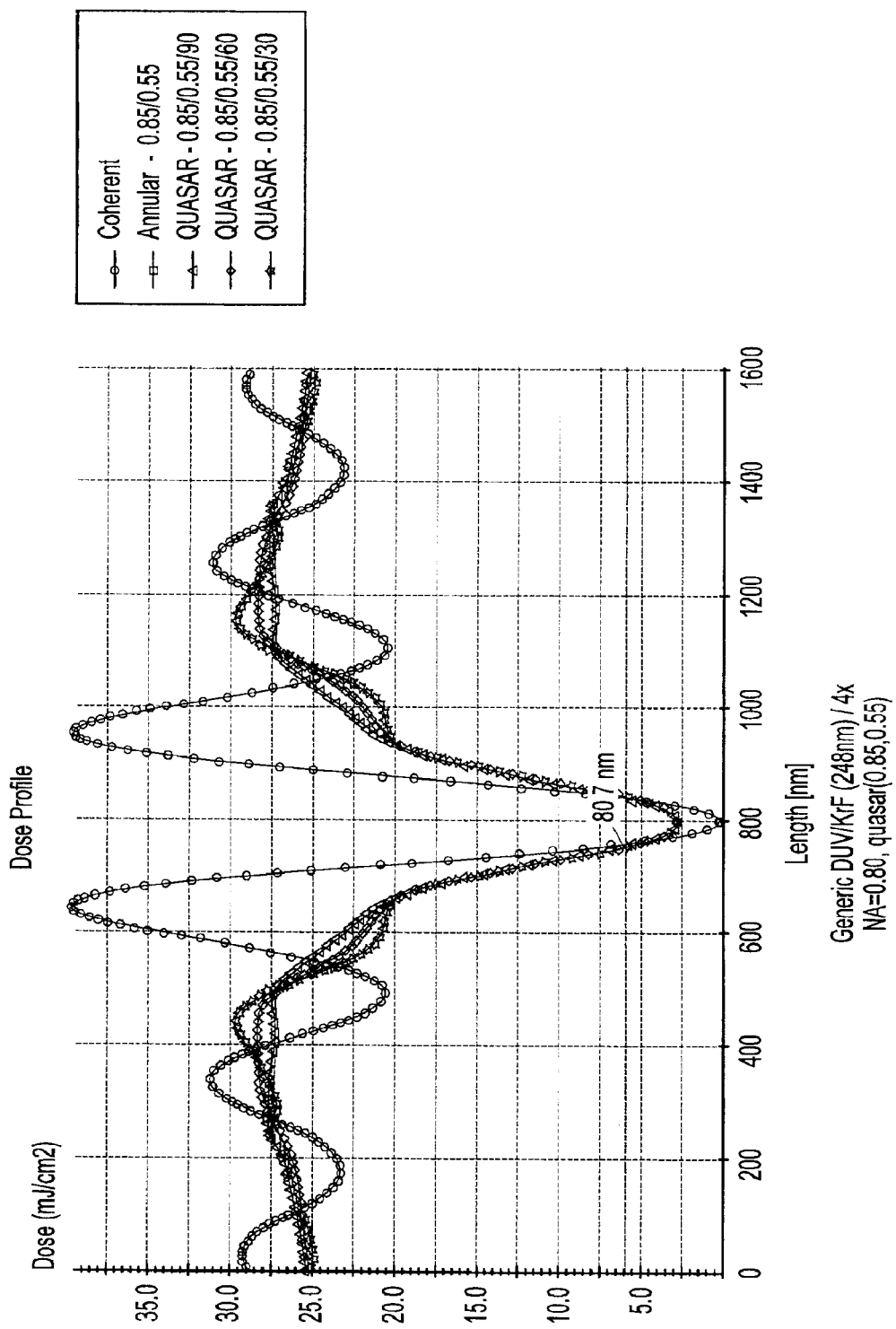
FIG. 2 is an exemplary aerial intensity profile of a 180° phase-edge utilizing off-axis illuminations.

Referring to FIG. 2, it is shown that when off-axis illumination is utilized to illuminate the 180° phase-edge, the contrast is further reduced and $I_{min}$ continues to increase. However, the image contrast degradation of a single phase-edge caused by strong off-axis illumination may not be sufficient to assure the phase-edge will not print. As shown in FIG. 2, for each of the off-axis illumination conditions, the phase-edge is still printed on the wafer as the value of $I_{min}$ remains below the printing threshold defined by the dotted horizontal line illustrated in FIG. 2.

Figure 3:
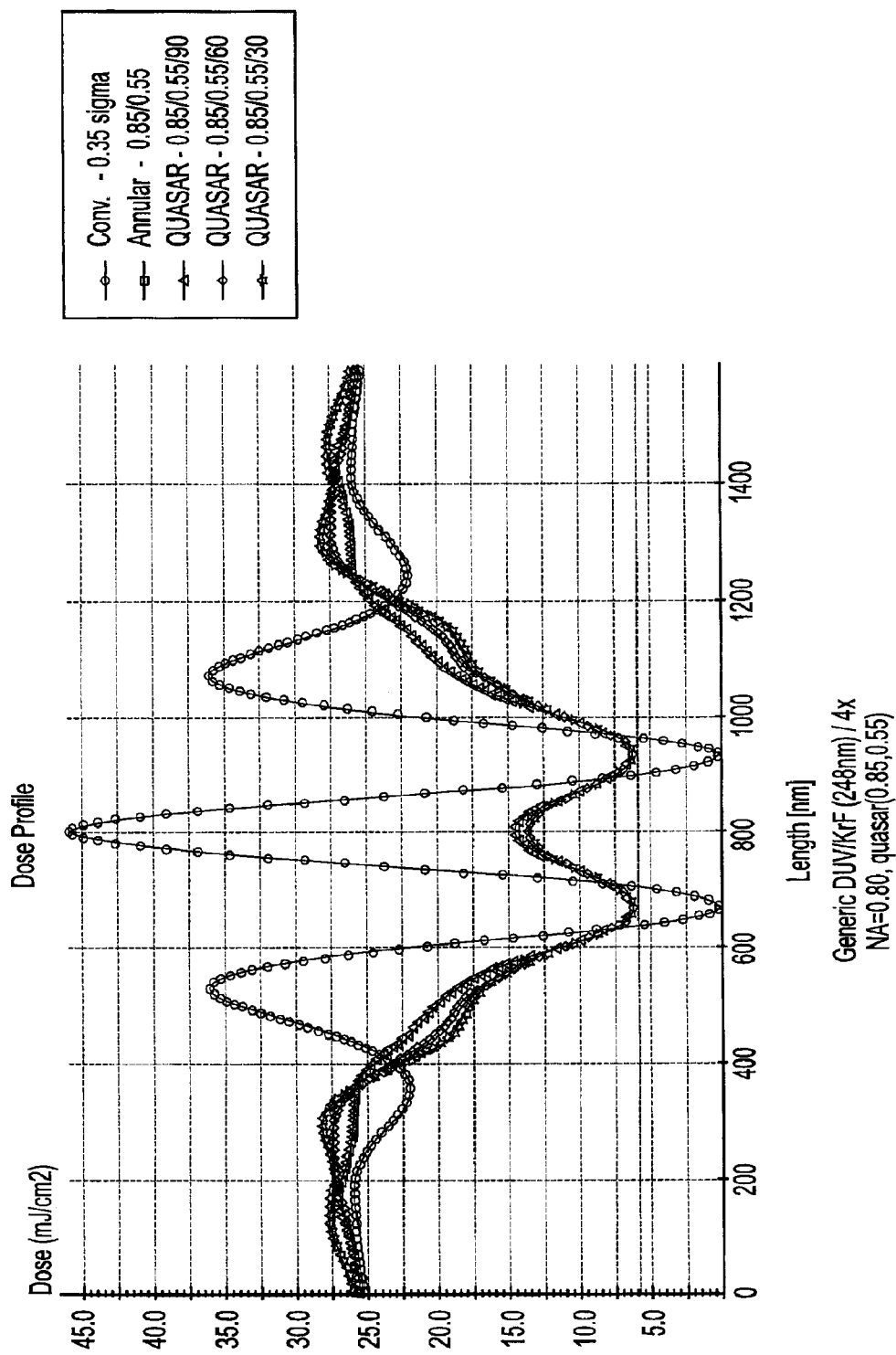
FIG. 3 illustrates the aerial image intensity of two phase-edges that are 200 nm apart when illuminated with conventional illumination and with off-axis QUASAR illumination.

It has been discovered that the contrast can be further reduced (i.e., $I_{min}$ further increased) by placing two phase-edges in close proximity to one another. FIG. 3 illustrates the aerial image intensity of two phase-edges that are 200 nm apart when illuminated with conventional illumination and with off-axis QUASAR illumination (which corresponds to quadrapole illumination). The two phase-edges are located at approximately 650 nm and 850 nm as defined by the horizontal axis of FIG. 3. As shown, the conventional illumination results in two high contrast dark images at each of the phase-edges, which results in the printing of the two phase-edges (i.e., $I_{min}$ is below the printing threshold). However, when utilizing QUASAR illumination, the result is a very low contrast image and a high $I_{min}$ at each of the phase-edge locations. As shown, in FIG. 3, each of the off-axis QUASAR illuminations results in an $I_{min}$ which is above the printing threshold. Thus, the phase-edges do not print on the wafer. It is noted that the distance between the phase-edges (which in the current example is 200 nm) necessary to obtain the foregoing results is process dependent in that it varies in accordance with, for example, the wavelength (λ), the numerical aperture (NA) and the illumination technique utilized by the imaging system. The optimum separation for a given set of processing conditions is readily determined by empirical methods. It is noted, however, that as a general rule, when the phase-edges are separated by greater than approximately 0.42 λ/NA, the image of the phase-edge is so greatly degraded that typically the phase-edges will no longer print.

Figure 4:
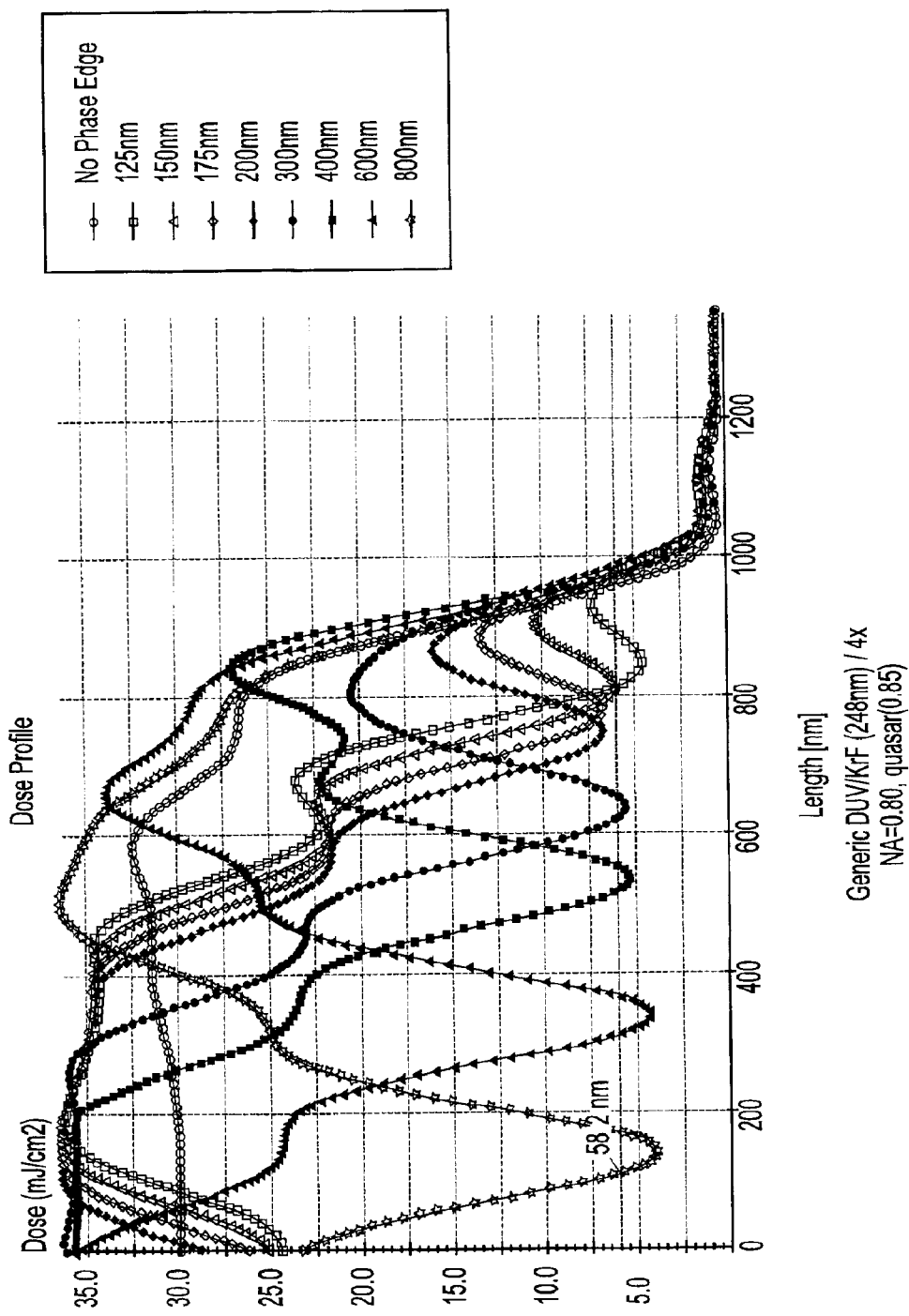
FIG. 4 contains a set of aerial images illustrating the variations of $I_{min}$ resulting from various placements of a phase-edge relative to a feature edge for a given set of processing conditions.

The inventors further discovered that a similar effect (i.e., a resulting low contrast image and increased $I_{min}$) occurs when a single phase-edge is brought into proximity to a chrome feature edge. In other words, by placing the phase-edge a predetermined distance away from the edge of a chrome feature and utilizing strong off-axis illumination, it is possible to prevent the phase-edge from printing on the wafer. FIG. 4 contains a set of aerial images illustrating the variations of $I_{min}$ resulting from various placements of a phase-edge relative to a feature edge for a given set of processing conditions.

Referring to FIG. 4, the edge of the chrome feature is located at approximately 1000 nm as defined by the horizontal axis of FIG. 4. As shown in FIG. 4, when the phase-edge is positioned 800 nm, 600 nm, 400 nm or 300 nm from the feature edge, the phase-edge is printed on the wafer, as each of the corresponding values of $I_{min}$ is below the print threshold (defined by the dotted line in FIG. 4). However, when the phase-edge is positioned 200 nm, 175 nm or 150 nm from the feature edge, the phase-edge does not print, as the corresponding values of $I_{min}$ are above the print threshold. Specifically, $I_{min}$ reaches its maximum value (above the 6.0 printing threshold used in this example) when the phase-edge is between 220 nm and 180 nm away from the chrome feature edge. It is noted that as the distance between the phase-edge and the chrome feature edge continues to decrease, $I_{min}$ begins to decrease again such that at 150 nm, $I_{min}$ equals the printing threshold of 6.0. At a distance of 125 nm, $I_{min}$ is well below the printing threshold and as a result, the phase-edge prints on the wafer. It is again noted that the distance between the phase-edge and the edge of the chrome feature necessary to prevent the phase-edge from printing on the wafer is process dependent in that it varies in accordance with, for example, the wavelength (λ), the numerical aperture (NA) and the illumination technique utilized by the imaging system.

Another method of controlling the printability of a phase-edge (i.e., change the resulting aerial image) is to use a phase-shift other than 180°. It is noted that a phase-edge results in the generation of a strong dark image because of the total destructive interference that occurs when light on either side of the phase-edge is shifted by 180°. However, if the phase of the light were shifted by 90° instead of 180°, the intensity of the resulting image would decrease (i.e., $I_{min}$ would increase) due to the fact that there would only be partial destructive interference. As such, by varying the amount of the phase-shift, it is possible to increase the $I_{min}$ value associated with a given phase-edge such that the phase-edge is non-resolvable (i.e., $I_{min}$ greater than the printing threshold).

Thus, by controlling the resulting aerial image of a phase-edge with the foregoing methods, it is possible to make a phase-edge sub-resolution under a wide range of imaging conditions. As a result, as explained in more detail below, the sub-resolution phase-edge can be utilized as an optical proximity correction feature.

One of the major objectives of correcting for optical proximity effects is achieving a sufficient "overlapping process window" for a given feature size through pitch. In other words, features having the same CD should be reproduced in the same manner on the wafer regardless of pitch between given features. Prior to the present invention, the utilization of sub-resolution scattering bars has been a means of addressing this problem of CD targeting through pitch. There are essentially two main elements affecting this through pitch CD variation. The first is the exposure dose to achieve the nominal CD at best focus which can be corrected for by simply biasing the feature. The second much more complex behavior that effects the through pitch CD performance is the behavior of the CD as the focus and exposure changes. This second element can be controlled by the addition of scattering bars.

Figure 5:
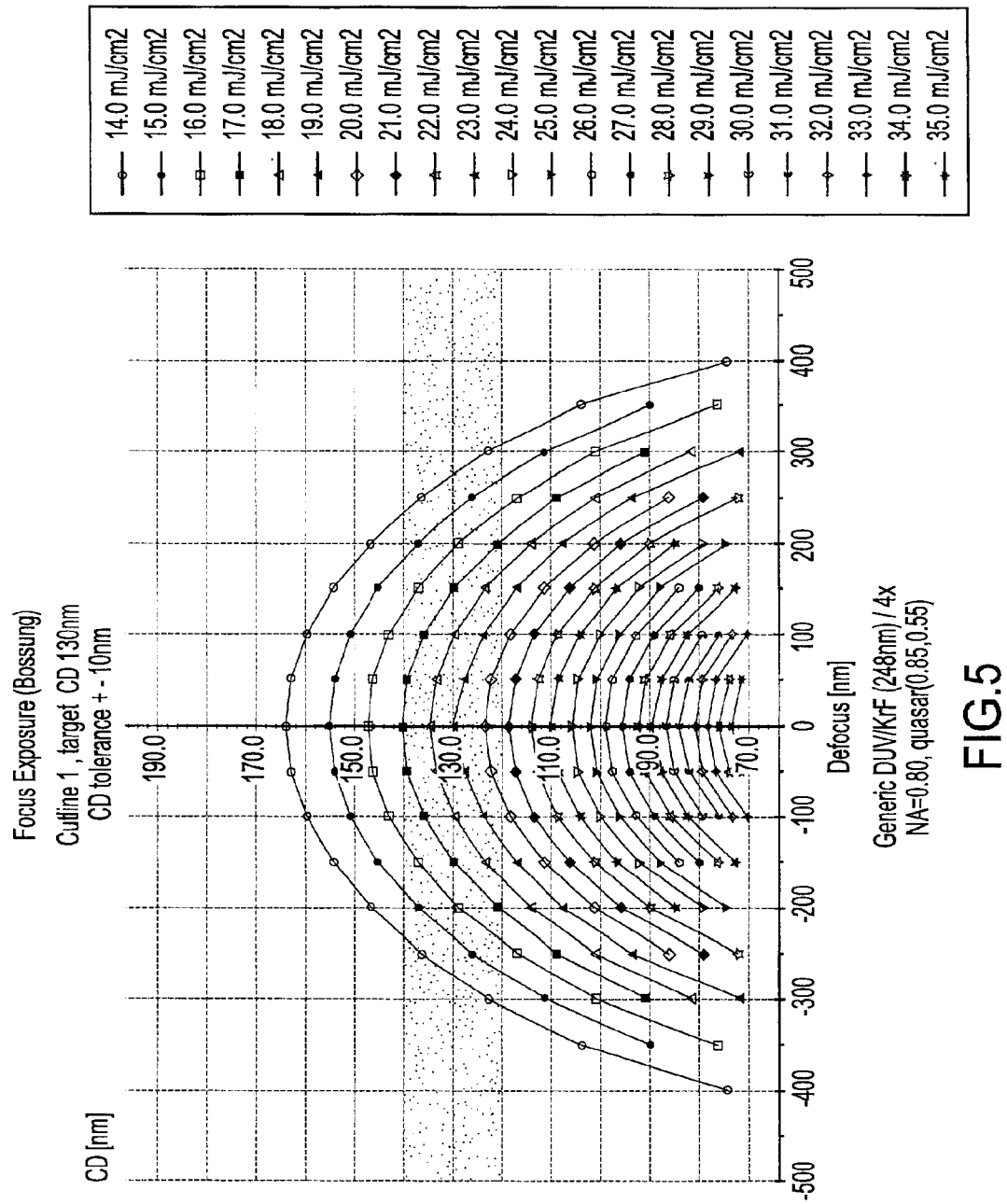
FIG. 5 illustrates simulation results of a focus/exposure matrix (FEM) for an isolated line.

FIG. 5 illustrates the need for optical proximity correction techniques. More specifically, FIG. 5 illustrates the simulated results of a focus/exposure matrix for an isolated line having a target CD of 130 nm using 0.80 NA and 0.85/0.55/30 QUASAR illumination. The simulation was conducted without utilizing any optical proximity correction techniques. It can be seen from the focus behavior that the resulting image is far from an iso-focal condition and that the depth of focus (DOF) is small (approximately 200 nm). This lack of DOF causes the isolated line to be a limiting factor in the through pitch overlapping process window. As such, it is clearly desirable to increase the DOF associated with the isolated line so as to increase the overall process window.

As stated above, prior to the present invention, this has been accomplished by utilizing sub-resolution features such as scattering bars. Indeed, by adding properly placed sub-resolution scattering bars, the DOF associated with the isolated line is increased substantially and the overlapping process window is greatly increased. However, in accordance with the present invention, sub-resolution phase-edges are utilized as the optical proximity correction features as opposed to sub-resolution scattering bars. The sub-resolution phase-edges provide significant advantages over known OPC features, such as scattering bars. For example, each phase-edge is essentially dimension-less in that there is no width dimension (or CD) associated with the phase-edge. As such, the use of the phase-edge eliminates the need to be able to create an exceedingly small feature (i.e., scattering bar) on the mask. Moreover, because the phase-edges are dimension-less, they can be readily placed between features regardless of the pitch between the features.

Figure 6:
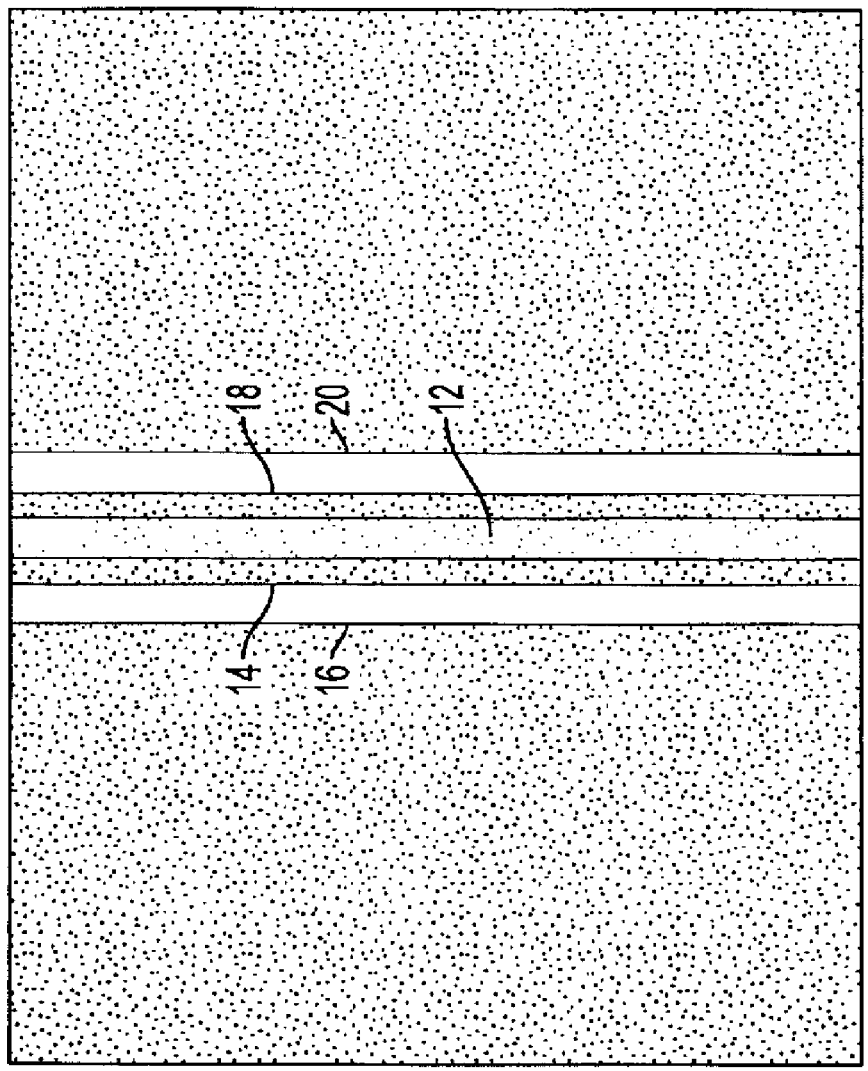
FIG. 6 illustrates an exemplary embodiment of phase-edges utilized as optical proximity correction features.

FIG. 6 illustrates an exemplary embodiment of how phase-edges can be utilized as optical proximity correction features. Referring to FIG. 6, in the given example, two phase-edges are created on each side of an isolated chrome line 12. More specifically, on the left side of the chrome line 12, a first phase-edge 14 is created at a distance of 140 nm from the left edge of the chrome line 12 and a second phase-edge 16 is created at a distance of 340 nm from the left edge of the chrome line. Similarly, on the right side of the chrome line 12, a first phase-edge 18 is created at a distance of 140 nm from the right edge of the chrome line 12 and a second phase-edge 20 is created at a distance of 340 nm from the right edge of the chrome line. It is again noted that the optimal placement of the phase-edges relative to one another and to the feature to achieve the desired correction is process dependent. Indeed, as with scattering bars, optimal placement of phase-edges can be readily determined by empirical methods.

Figure 7:
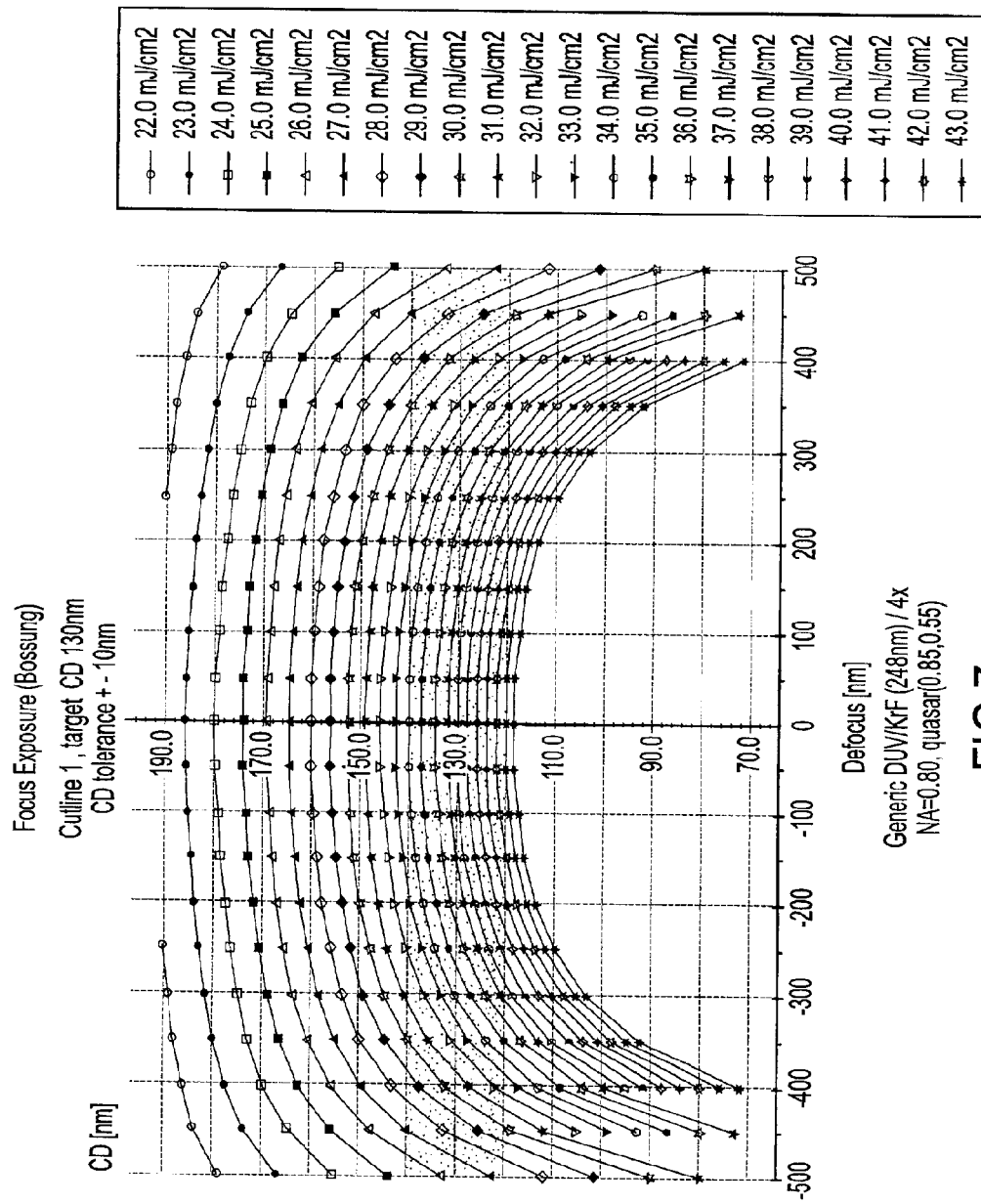
FIG. 7 illustrates simulation results of a focus/exposure matrix for an isolated line with sub-resolution phase-edges utilized as OPC features.

FIG. 7 illustrates the improvement obtained by utilizing the phase-edges depicted in FIG. 6 as OPC features for the 130 nm line. The processing conditions utilized in the simulation are the same as those utilized in the simulation depicted in FIG. 5. Referring to FIG. 7, it is shown that the inclusion of the phase-edges results in a significant improvement in the depth of focus for the 130 nm line. As shown, the depth of focus becomes approximately 600 nm as opposed to the approximately 200 nm depth of focus obtained in the simulation depicted in FIG. 5.

Figure 8:
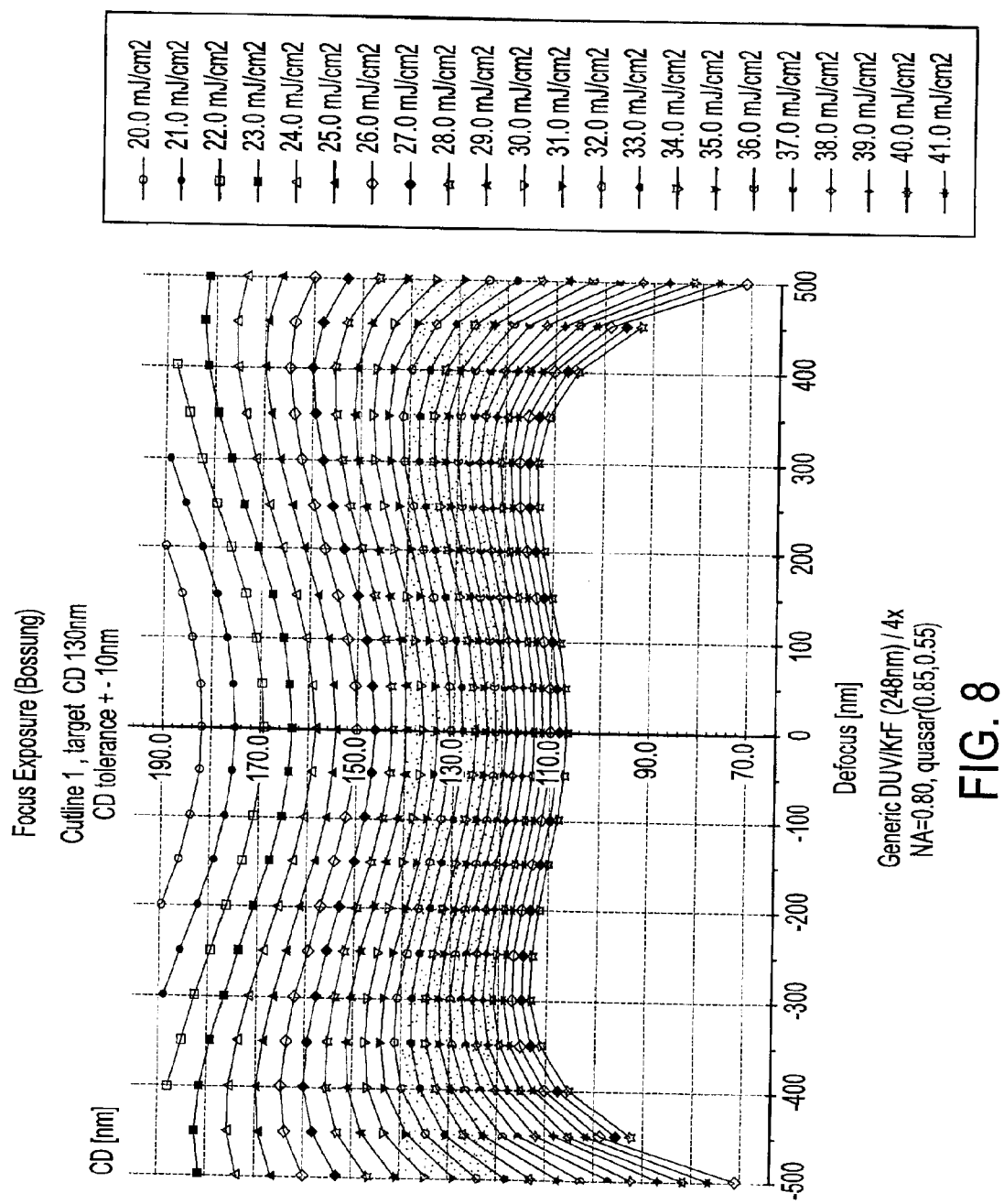
FIG. 8 illustrates simulation results of a 130 nm targeted isolated line when the phase-edges are placed 160 nm and 360 nm away from the isolated line.

As noted above, the position of the sub-resolution phase-edges relative to the feature and each other will have an effect on the imaging of the isolated 130 nm feature. FIG. 8 shows the simulation results of the same 130 nm isolated line when the phase-edges are placed 160 nm and 360 nm away from the chrome line edge. As shown, utilizing this placement of the phase-edges, the dose to target is approximately 33 mJ and the through focus behavior has been over corrected beyond the ideal iso-focal behavior. Thus, such a placement is not optimal.

The phase-edges illustrated in FIG. 6 can be manufactured utilizing various processing methods. For example, by utilizing a single chrome feature, two phase-edges can be generated in the mask design. More specifically, the process steps would include forming a chrome feature having a width equal to the desired separation of the two phase-edges on a quartz substrate. Next, utilizing the chrome feature as a shield, the quartz substrate is etched to a depth necessary to create the desired phase difference between the etched portion of the substrate and the unetched portion of the substrate. Then, the chrome feature (i.e., shield) is removed and the result is the generation of two phase-edges, which are spaced apart by a distance equal to the width of the chrome feature. Of course, the chrome feature utilized to form the phase-edges can be positioned as necessary relative to the feature to be printed. In the event only a single phase-edge is desired, this can be accomplished by extending one side of chrome shield until it contacts the adjacent feature to be printed. In this instance, a single phase-edge will be formed at the location of the opposite edge of the chrome shield (i.e., the edge of the shield that does not contact the feature to be printed).

As another example of the benefits of the present invention, it is shown how the use of a single phase-edge OPC feature can be utilized in place of chromeless scattering bars. As is known, chromeless phase-shift mask (CLM) technology is showing promise as an option for imaging features as small as $\lambda/5$. CLM takes advantage of a high contrast dark image that is formed when two phase-edges come into close proximity to each other, for example, in the range of 120 nm to 50 nm for a wavelength of 248 nm. While this image enhancement is beneficial as a means to increase the resolution of an imaging system, it also increases the printability of features that are intended to be sub-resolution. As a result, for chromeless scattering bars not to print, the scattering bars must be very small (i.e., less than 50 nm) or the scattering bars must be half-toned in a manner to result in an effective size of less than 50 nm. However, it is exceedingly difficult to manufacture scattering bars having a width of less than 50 nm.

As a result of the present invention, there is no need to manufacture scattering bars having such widths. As noted above, in accordance with the present invention, a pair of phase-edges can be placed where previously a half-toned chromeless scatter bar would be formed. In the manner described above, the phase-edges are separated from each other and from the phase-edge of the primary feature in such a manner that they do not print under the given imaging conditions. Thus, by utilizing such phase-edges as OPC features, there is no need to generate scattering bars have such small width dimensions.

Figure 9:
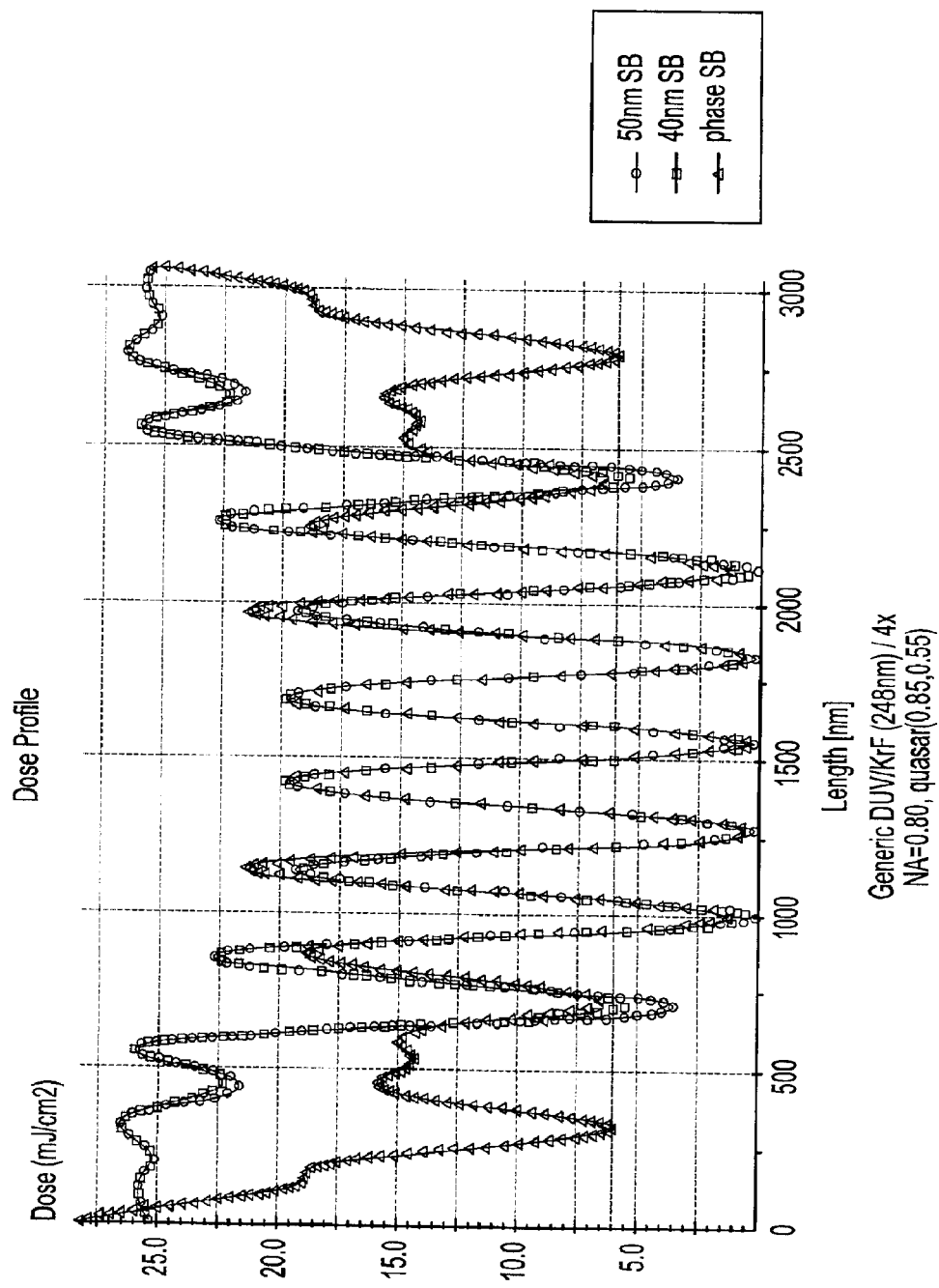
FIG. 9 illustrates a comparison between the printability of a 50 nm chromeless scattering bar, a 40 nm chromeless scattering bar, and a single phase-edge when placed adjacent a 100nm 5 bar pattern.

FIG. 9 compares the printability of a 50 nm chromeless scattering bar, a 40 nm chromeless scattering bar, and a single phase-edge when placed adjacent a 100nm 5 bar pattern. Referring to FIG. 9, the 5 bars (i.e., features to be printed) are placed at approximately 1000 nm, 1300 nm, 160 nm, 1900 nm and 2200 nm as defined by the horizontal axis of FIG. 9. As shown from this simulation, both the 40 nm chromeless scattering bar and the 50 nm chromeless scattering bar will print on the wafer, as both have an $I_{min}$ value that falls below the print threshold. However, the single phase-edge maintains an $I_{min}$ value which exceeds the print threshold and therefore does not print on the wafer. Indeed, it has been determined that under the conditions utilized in the simulation depicted in FIG. 9, in order to obtain a chromeless scattering bar which does not print, the scattering bar must be approximately 35 nm wide (140 nm at 4×), which is beyond current photomask manufacturing capabilities. Thus, the present invention allows for the placement and use of a sub-resolution OPC feature under imaging conditions that would have previously resulted in the printing of the OPC features utilizing prior art techniques.

Figure 10:
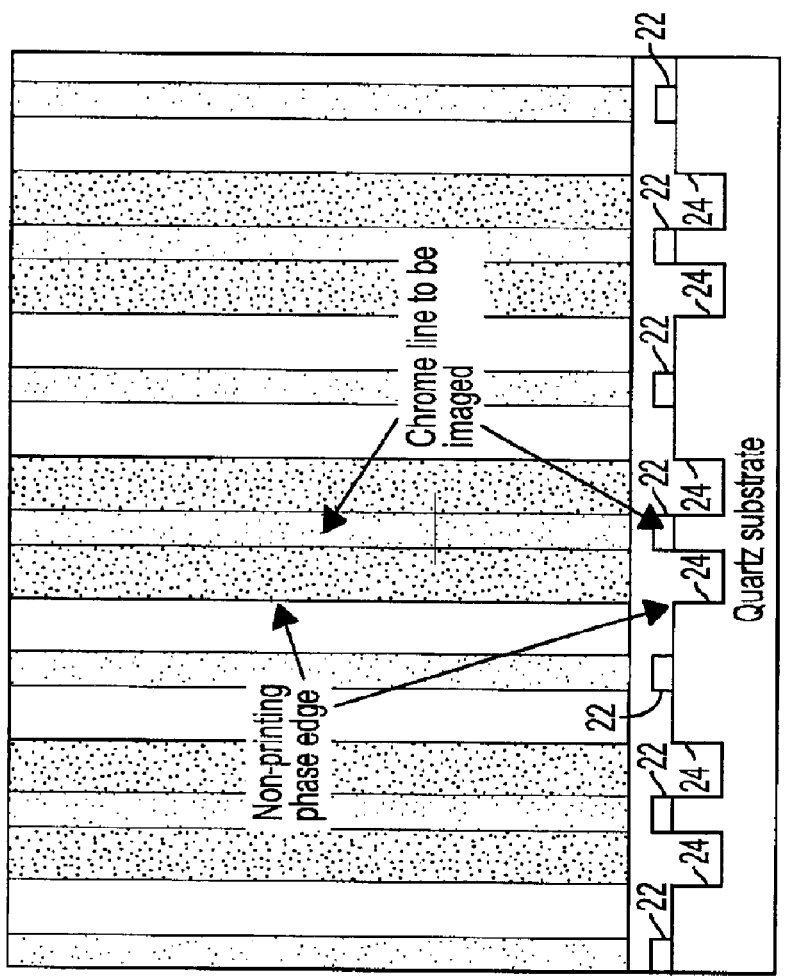
FIG. 10 illustrates an example of utilizing a single phase-edge as a sub-resolution OPC feature for intermediate pitch values that do not allow enough space for placement of a conventional scattering bar.
Figure 11:
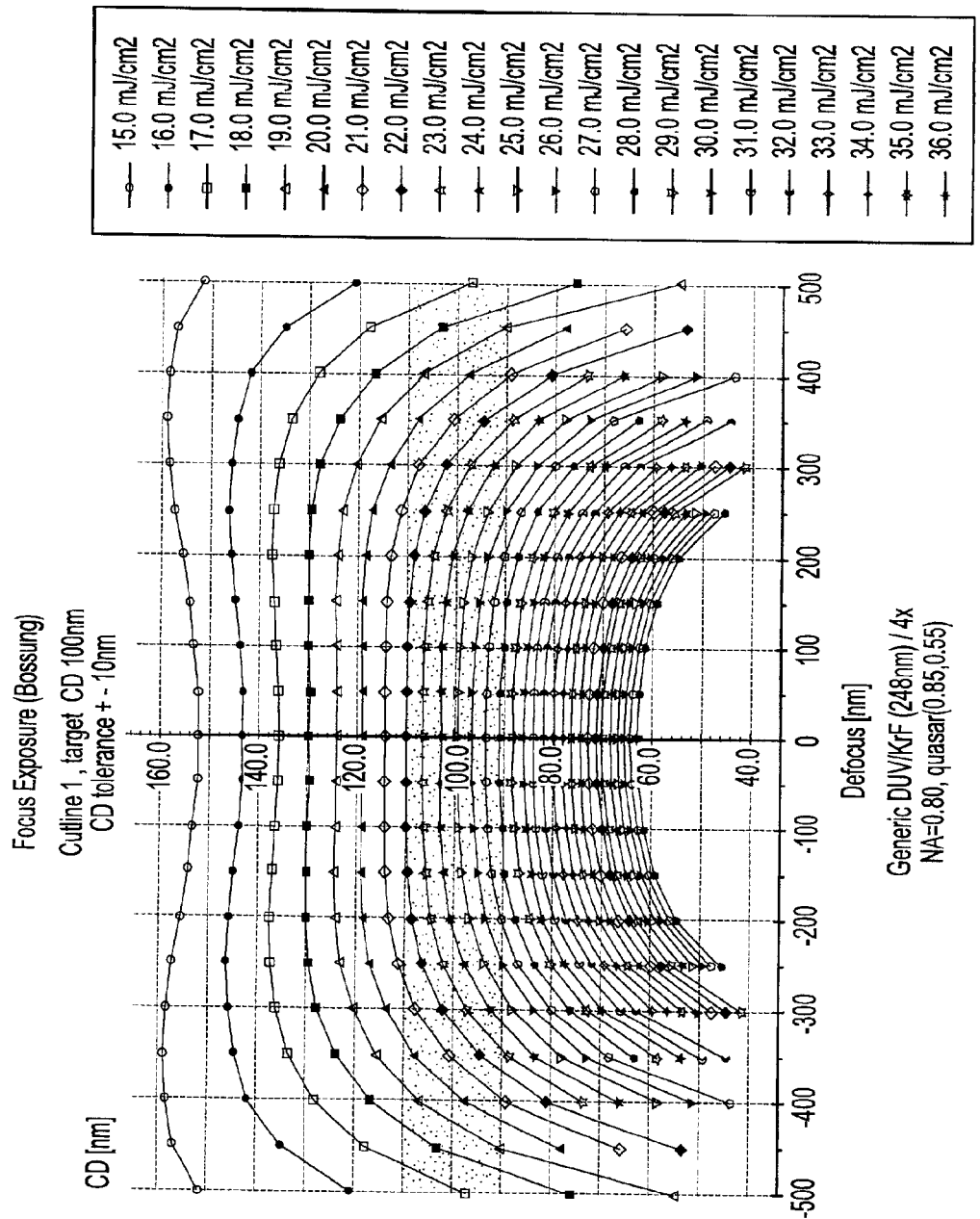
FIG. 11 shows the results of a focus/exposure simulation on a 100 nm chrome line pattern at a 400 nm pitch when a single phase-edge is placed between the chrome lines as shown in FIG. 10.

Another benefit of using a phase-edge as a sub-resolution assist feature is that it is possible to place a phase-edge in a space that is not wide enough to accommodate a conventional scattering bar. FIG. 10 illustrates this concept of placing a phase-edge in between fairly dense features. Referring to FIG. 10, the chrome features 22 to be printed on the wafer have a pitch of 400 nm, which is too small to allow placement of a scattering bar between the features. However, it is possible to place phase-edges 24 between each feature 22. Indeed, it desirable to place phase-edges between the features because strong proximity effects are present and the phase-edges can correct these proximity effects. FIG. 11 shows the results of a focus/exposure simulation on a 100 nm chrome line pattern at a 400 nm pitch when a single phase-edge is placed between the chrome lines as shown in FIG. 10. As can be seen from the plots in FIG. 11, the resulting 100 nm chrome lines exhibit a substantially isofocal condition and a significant depth of focus (approximately 600 nm). Clearly, such performance results would not be possible if the phase-edges were omitted.

The phase-edges 24 disposed between the chrome features 22 illustrated in FIG. 10 can be manufactured in substantially the same manner as described above with reference to FIG. 6. For example, first, chrome is deposited over the top surface of the quartz substrate. Next, the chrome is removed from the portions of the substrate to be etched, and then the quartz substrate is etched to a depth necessary to create the desired phase difference between the etched portion of the substrate and the unetched portion of the substrate. Next, the chrome features 22 are protected and remaining chrome on the surface of the quartz substrate is removed. The result is the structure depicted in FIG. 10, in which phase-edges 24 are created between chrome features 22. Of course, any other method of forming the phase-edges 24 in between the chrome features 22 can also be utilized.

Figure 12:
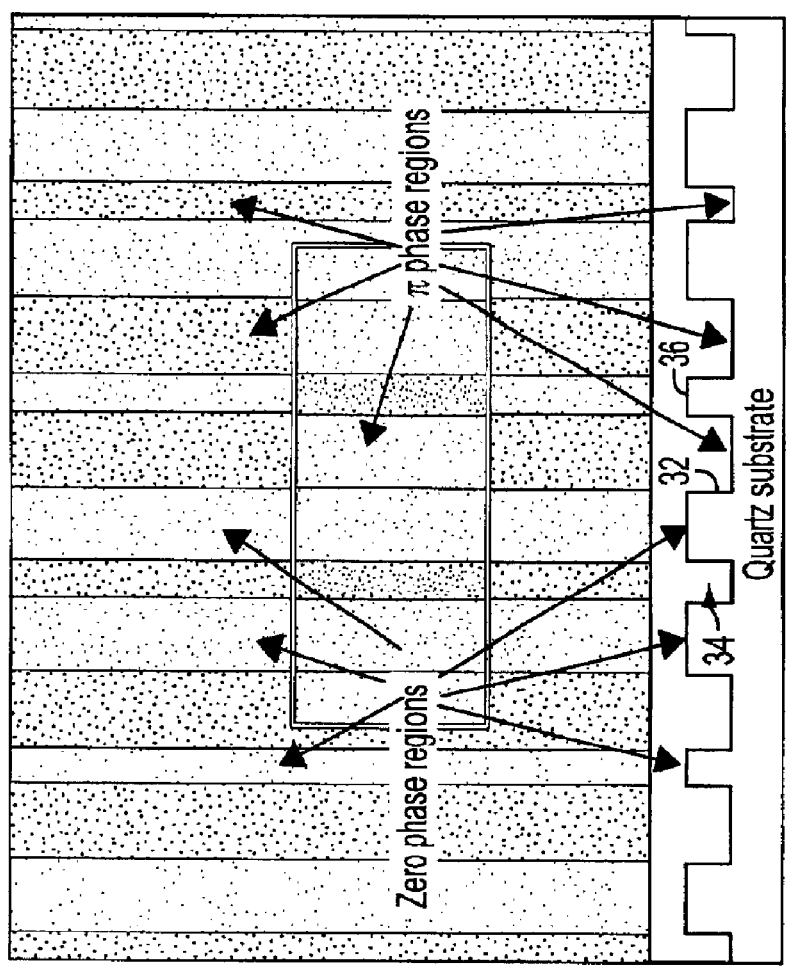
FIG. 12 illustrates an example of the placement of a single phase-edge between chromeless features.

FIG. 12 illustrates an example of the placement of a single phase-edge between chromeless features. In this example, the 100 nm lines are formed with both 180° phase lines surrounded by 0° phase fields and 0° phase lines surrounded by 180° phase fields. The sub-resolution phase-edge forms the transition between the 0° phase field region and the 180° phase field region. The use of the sub-resolution phase-edge provides addition capabilities to control the through focus behavior of lines at varying pitches so as to be able to increase the through pitch overlapping process window.

More specifically, referring to FIG. 12, in accordance with the present invention, it is possible to place a phase-edge 32 between two chromeless features, one being a trench 34 and one being a mesa 36. Both the trench feature 34 and the mesa feature 36 will print. The phase-edge 34 does not print, but does function as an optical proximity correction feature.

It is further noted that as a result of using phase-edges as sub-resolution features, two effects are created which effect the aerial image formation. The primary effect is the placement of a dark feature in a position that changes the effective pattern density, thereby changing the imaging behavior of isolated or near isolated lines to that of semi-dense lines. This effect was utilized to change the through focus behavior in the manner described above. The second effect is the phase-shifting that occurs in areas between the sub-resolution phase-edges. It is this effect that allows for phase patterns to be exploited to obtain additional advantages.

For example, by properly placing multiple phase-edges around an isolated line, the phase-shifting regions can be formed in a manner that generates behavior that can be characterized as an inverse Bessel image (i.e., a dark line with a theoretical infinite depth of focus). This is similar to printing a phase-edge with coherent light, except that in this case, strong off-axis illumination is used.

Figure 13:
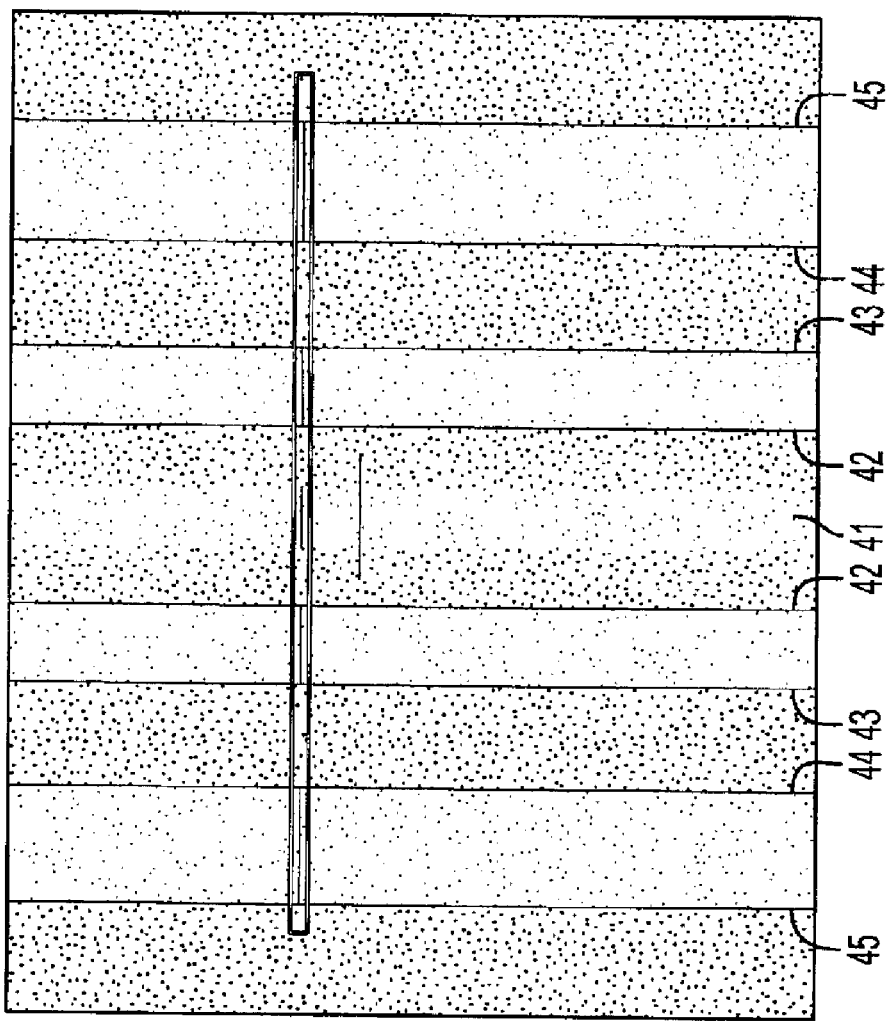
FIG. 13 illustrates an example of the formation of an inverse Bessel line utilizing sub-resolution phase-edges.
Figure 14:
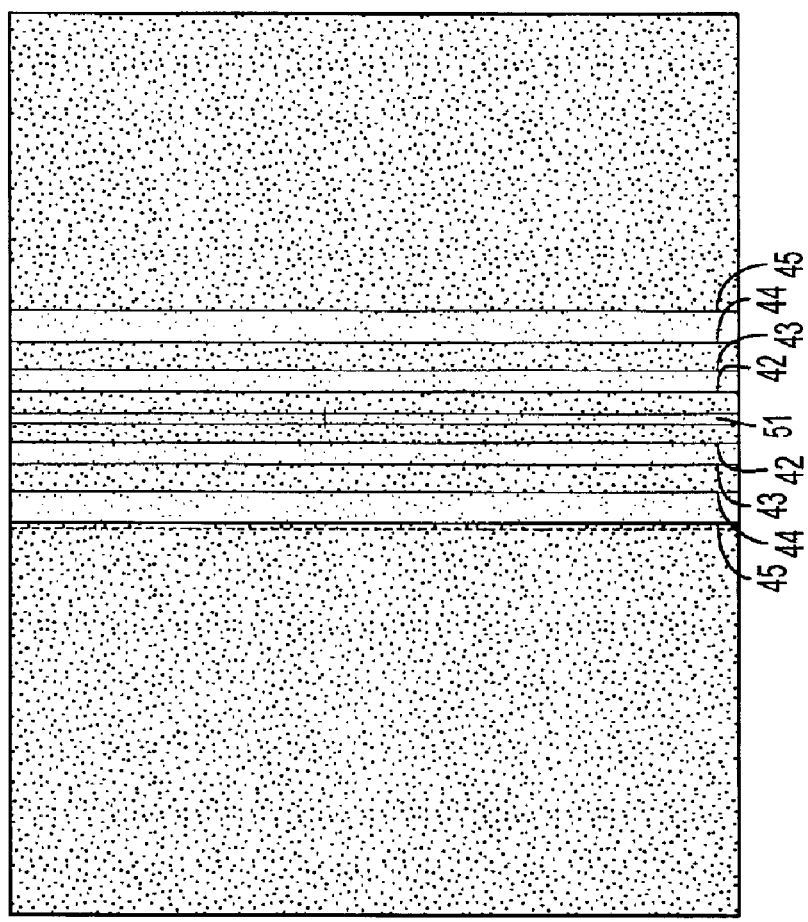
FIG. 14 illustrates the formation of an inverse Bessel line of FIG. 13 utilizing a chromeless phase-shift mask structure.

FIG. 13 illustrates an isolated chrome line 41 surrounded by four phase-edges 42, 43, 44, 45 on either side of the line 41. The phase-edges are placed in a manner so as to place the iso-focal point at the target CD feature size. To accomplish this, the phase-edges are not placed a uniform distance apart. As shown in FIG. 13, the spacing between sub-resolution phase-edges increases as the distance from the center chrome feature 41 increases. As was illustrated previously, the placement of phase-edges alters the through focus imaging behavior of a chrome line. In this example, the phase-edges are placed 150 nm, 350 nm, 620 nm, and 920 nm away from the edge of the chrome line. This method works equally well when the chrome feature is replaced with a chromeless phase-shift structure 51 (CLM) with similar sub-resolution phase-edge placements as is shown in FIG. 14.

Figure 15:
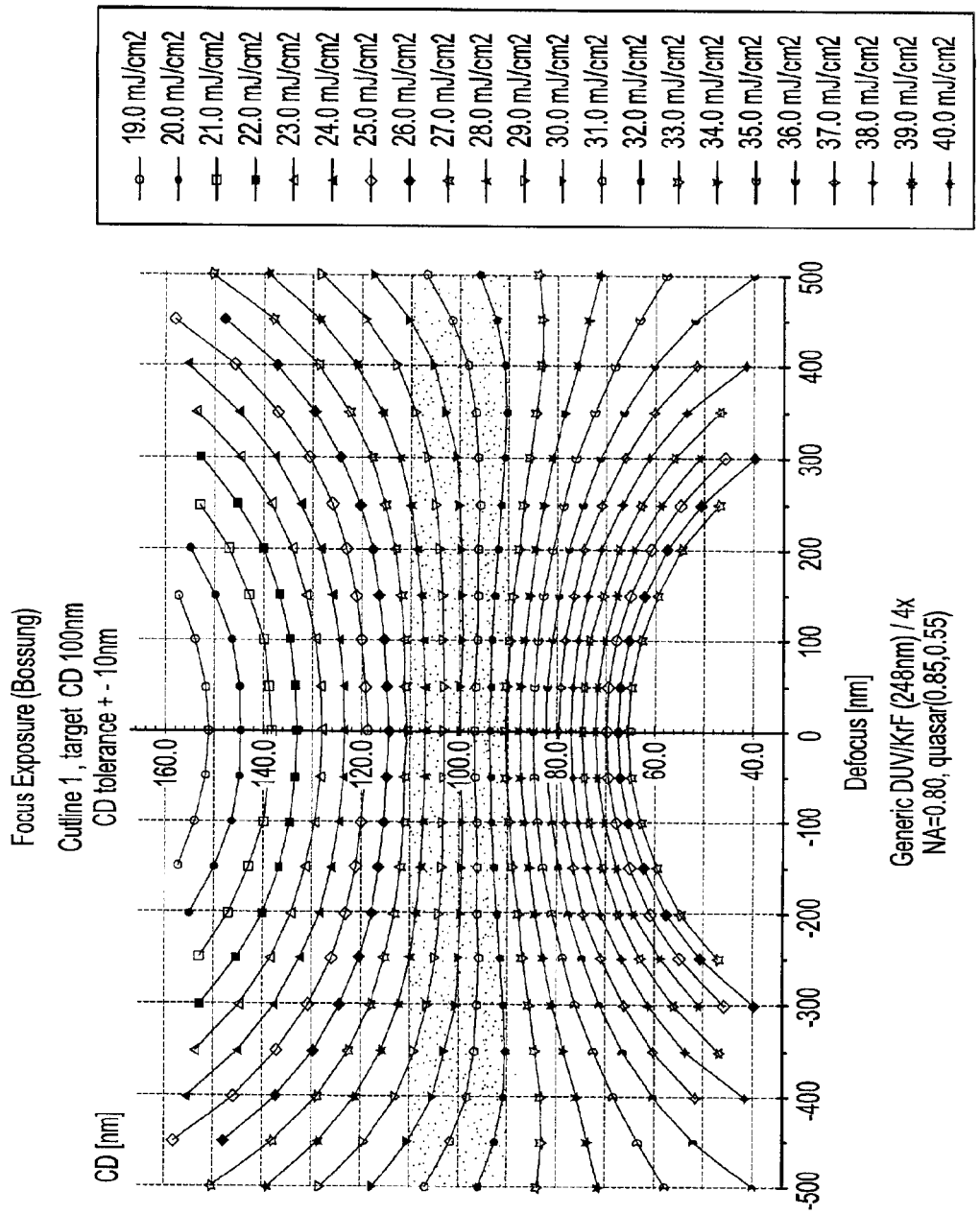
FIG. 15 shows the simulation results of an isolated 100 nm CLM inverse Bessel line and how the iso-focal point can be controlled by proper placement of the phase-edges.
Figure 16:
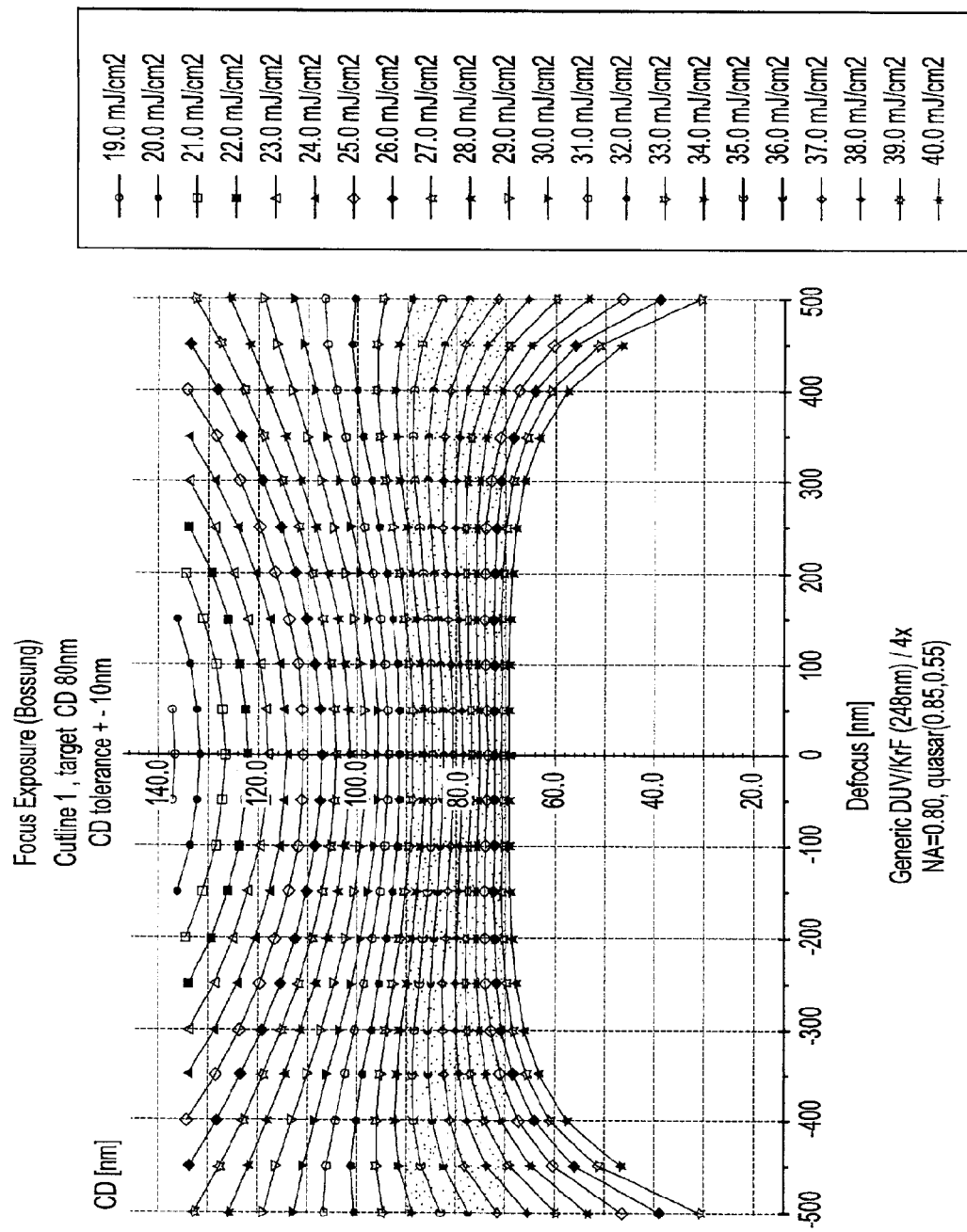
FIG. 16 shows the results of a focus/exposure simulation regarding a 80 nm chrome feature.
Figure 17:
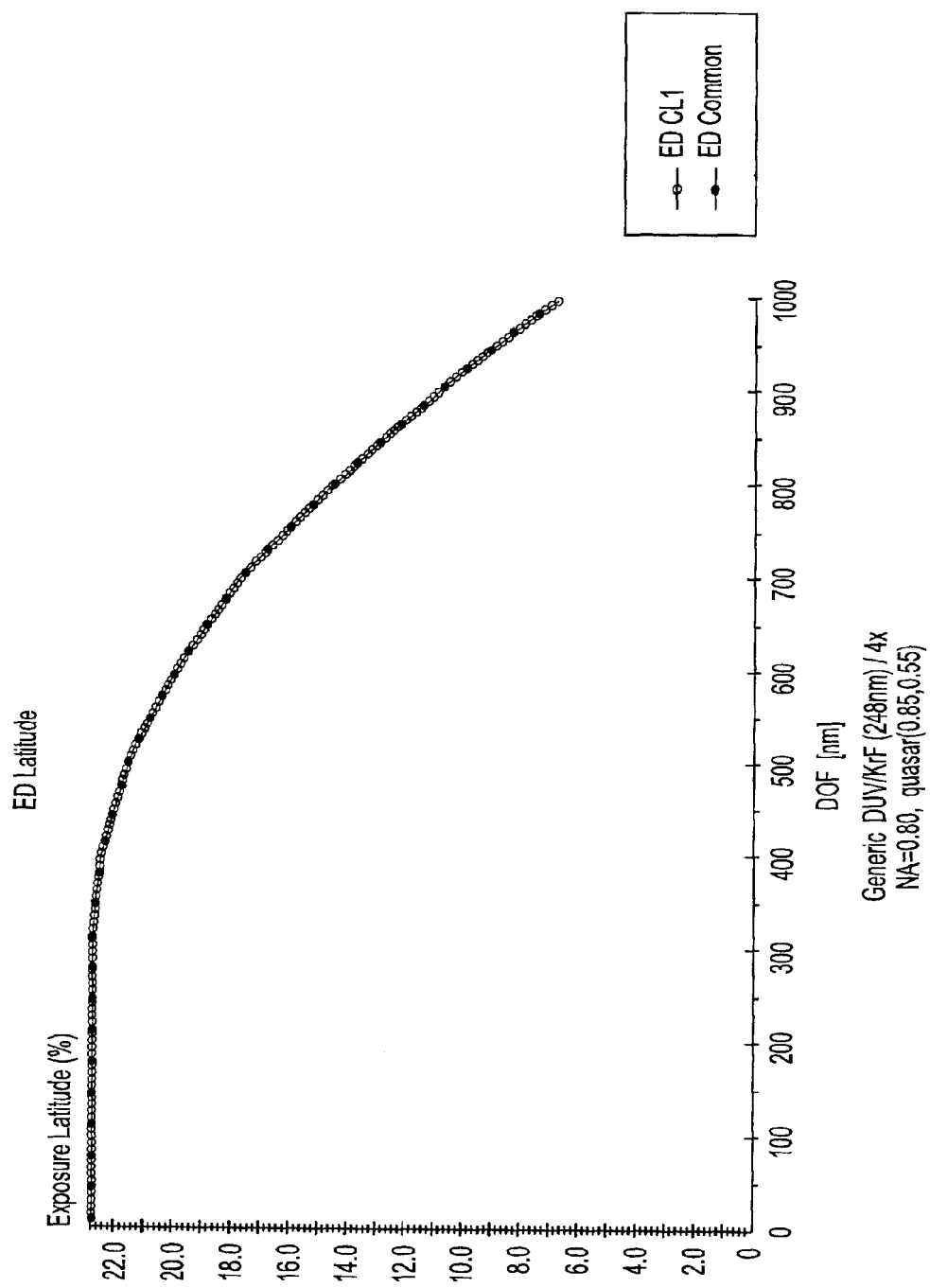
FIG. 17 shows the ED (exposure/dose) latitude plot indicating the depth of focus for the 80 nm isolated line exposed with 0.80 NA KrF imaging system and 0.85/0.55/30 QUASAR illumination.
Figure 18:
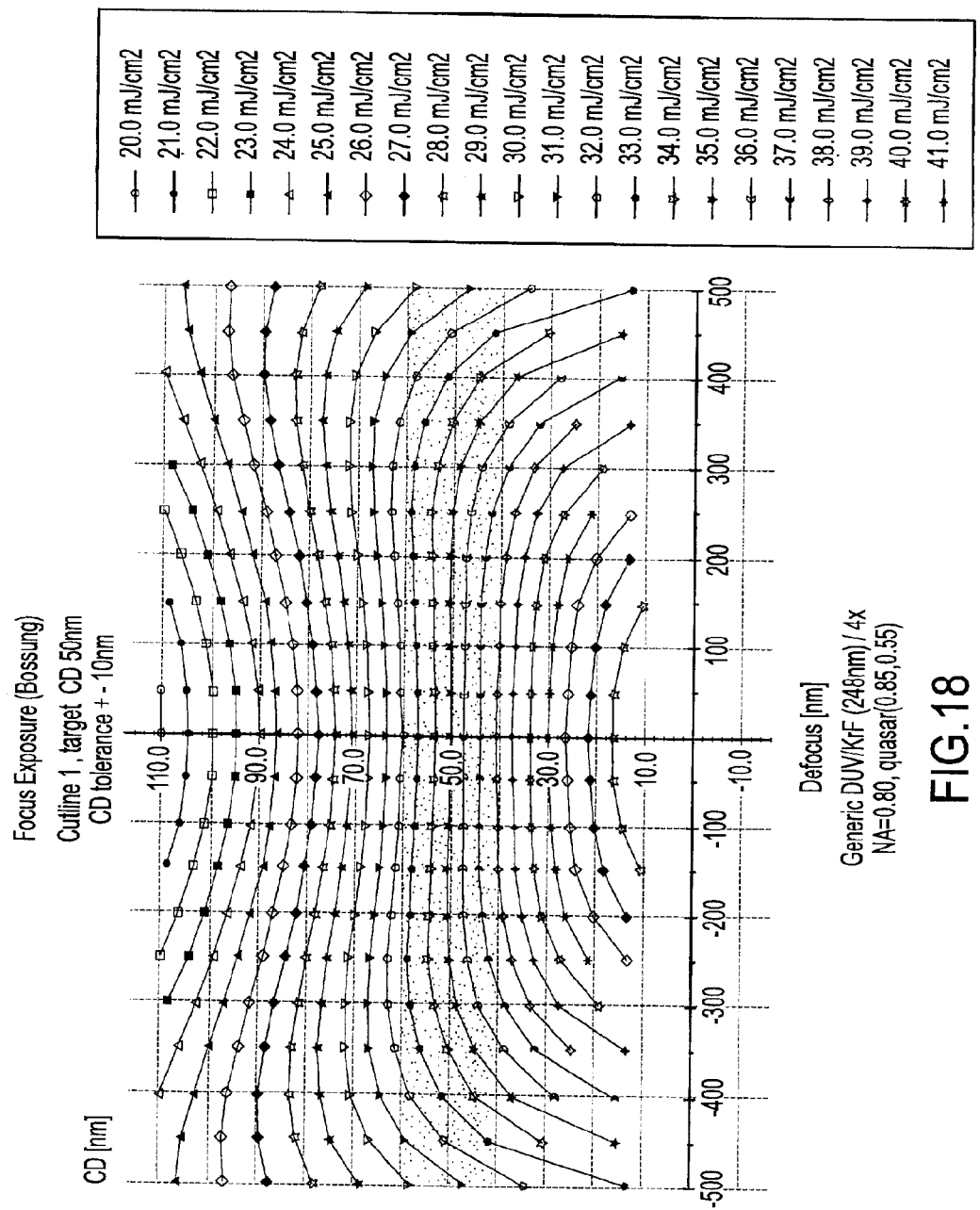
FIG. 18 shows the results of a focus/exposure simulation regarding a 50 nm chrome feature.
Figure 19:
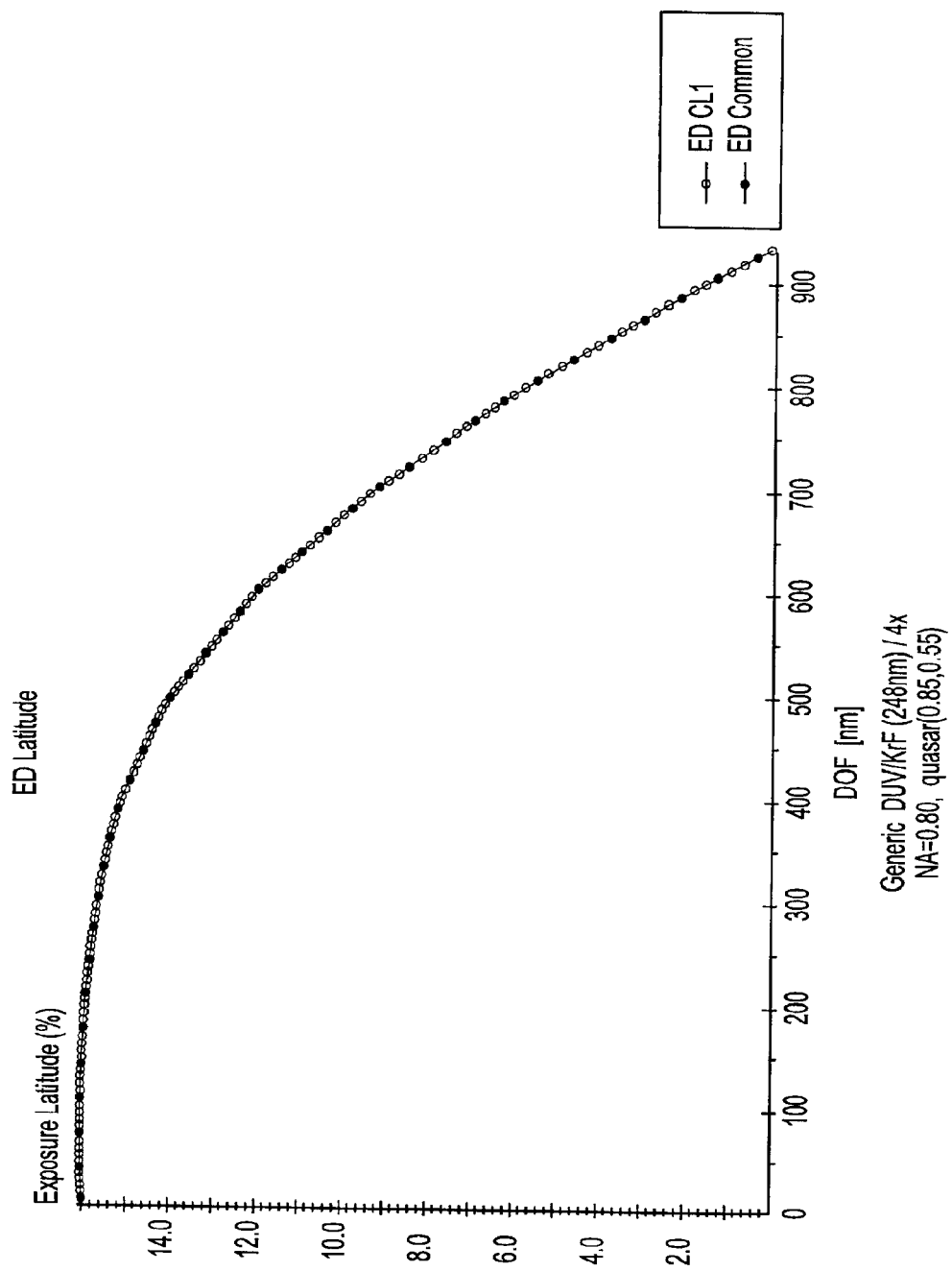
FIG. 19 shows the ED (exposure/dose) latitude plot indicating the depth of focus for the 50 nm isolated line exposed with 0.80 NA KrF imaging system and 0.85/0.55/30 QUASAR illumination.
Figure 20:
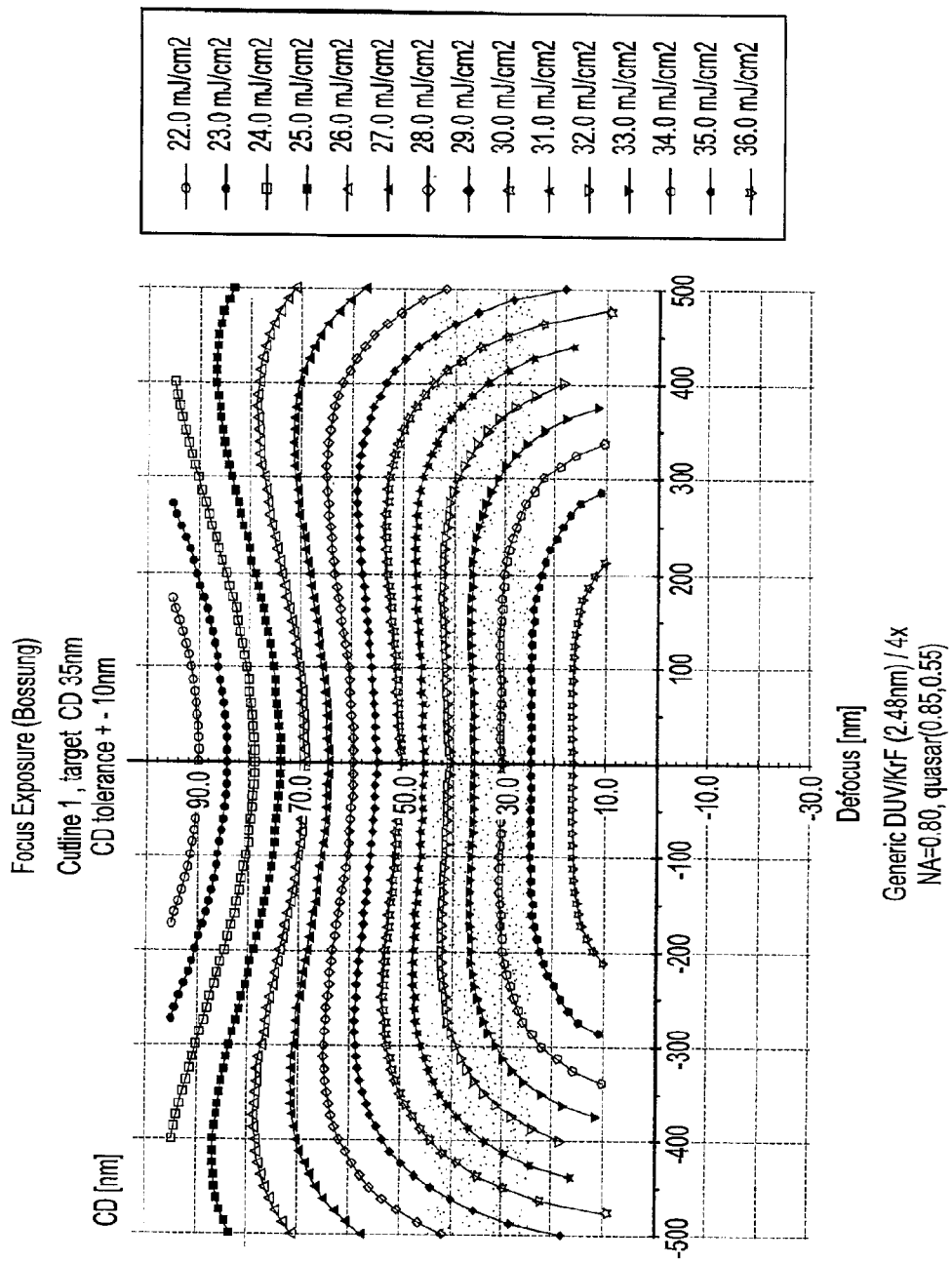
FIG. 20 shows the results of a focus/exposure simulation regarding a 35 nm chrome feature.

FIG. 15 shows the simulation results of an isolated 100 nm CLM inverse Bessel line and how by properly placing the phase-edges to form the inverse Bessel behavior with the particular illumination conditions, the iso-focal point can be controlled in a manner that places it at the target CD value. As shown, the result is a significant increase in the depth of focus. FEM simulations were run with a chrome primary feature at target CD sizes of 80 nm, 50 nm, and 35 nm with the inverse Bessel phase-edge design. In all cases, as shown in FIGS. 16, 18 and 20, the location iso-focal point was able to be placed near the particular target CD. FIGS. 17 and 19 show the ED (exposure/dose) latitude plots indicating that the depth of focus for the 80 nm and the 50 nm isolated lines, exposed with 0.80 NA KrF imaging system and 0.85/0.55/30 QUASAR illumination, had a DOF of 900 nm and 675 nm, respectively, at an exposure tolerance of 10%.

Figure 21A:
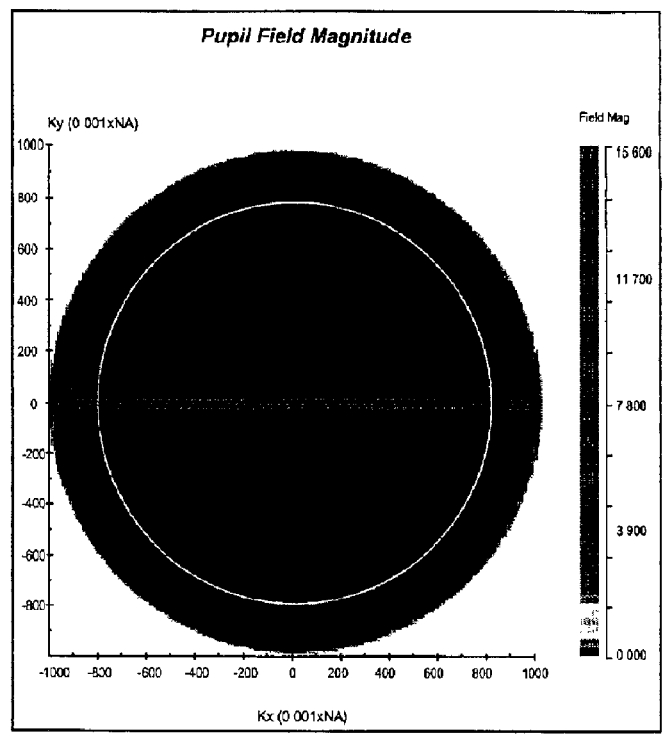
FIGS. 21A and 21B illustrate the effect sub-resolution assist features have on diffraction patterns.
Figure 21B:
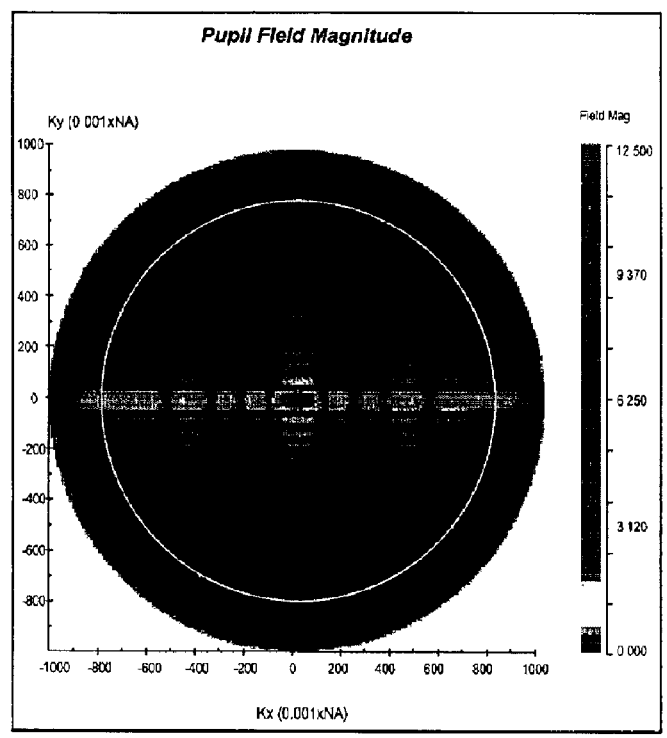

The improved DOF evident from the foregoing figures can be attributed to the impact sub-resolution assist features have on the diffraction pattern created by the exposure energy passing though an object at the image plan. FIGS. 21A and 21B illustrate the effect sub-resolution assist features have on the diffraction pattern. In the case of an isolated line, virtually all of the exposure energy is in the zero diffraction order (see, FIG. 21A). By properly placing the sub-resolution phase-edges, the energy is diverted from the zero order to the higher diffraction orders in a manner that causes increased DOF (see, FIG. 21B). While placing sub-resolution features at any location near a feature will cause exposure energy to be directed to the higher diffraction orders, as noted above, proper placement to achieve the DOF improvement is dependent upon the exposure wavelength, the illumination conditions, and the numerical aperture of the imaging system.

The ability to utilize phase-edges that do not print as an optical proximity correction feature allows for entirely new categories of correction methods. As an example, phase-edges extending out from the corners of opaque features can be used to improve corner rounding imaging in the same way serifs are currently used. Altering the distance between the main feature and a sub-resolution phase-edge along a feature can have a similar effect as what is currently achieved by placing jogs in the edges of the geometry.

Figure 22:
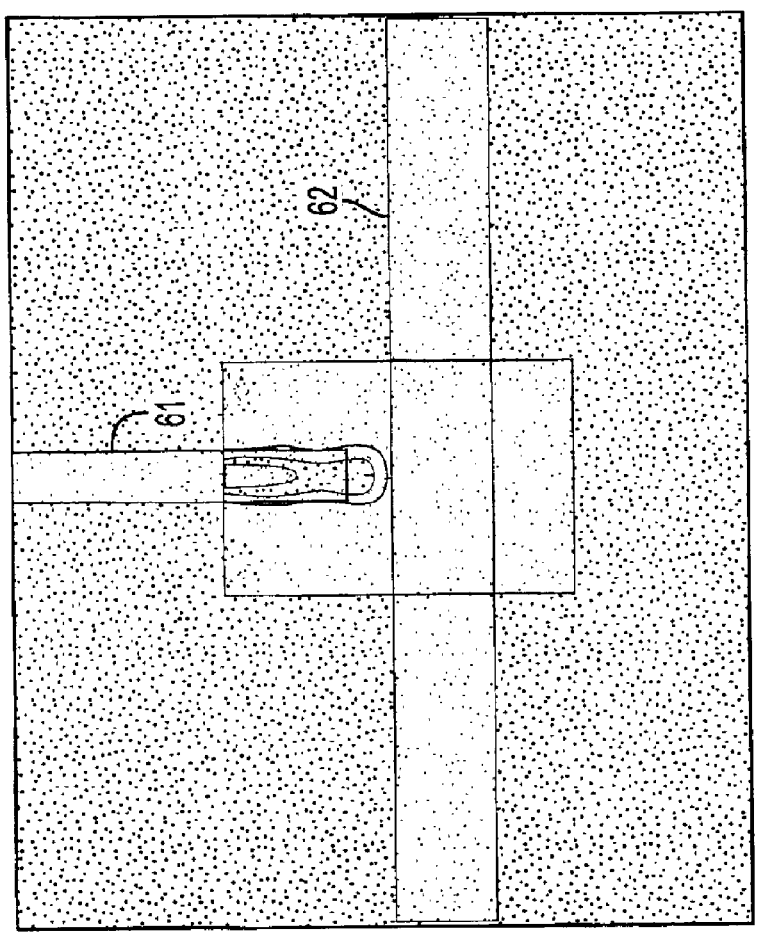
FIG. 22 shows an example of how sub-resolution phase-edges can be utilized to control line end shortening.

As an example of the versatility of using sub-resolution phase-edges, FIG. 22 shows how line end shortening can be corrected for by placing a phase-edge 62 perpendicular to the line 61 whose end shortening is to be corrected. The phase-edge will not print in regions where it is between lines because the imaging conditions and distance to another phase-edge cause it to be sub-resolution. However, when the phase-edge is near the end of a line, the end of that line is pulled to the phase-edge because of the interaction between the phase-edge of the end of the line and the phase-edge of the correction feature. As such, very fine line end control can be achieved.

In another variation, the sub-resolution phase-edge does not need to be a straight line but can contain sub-resolution jogging. Further, as noted above, it is also possible to use phase-edges having shifts other than 180° such as 60°, 90°, or 120°.

Figure 23:
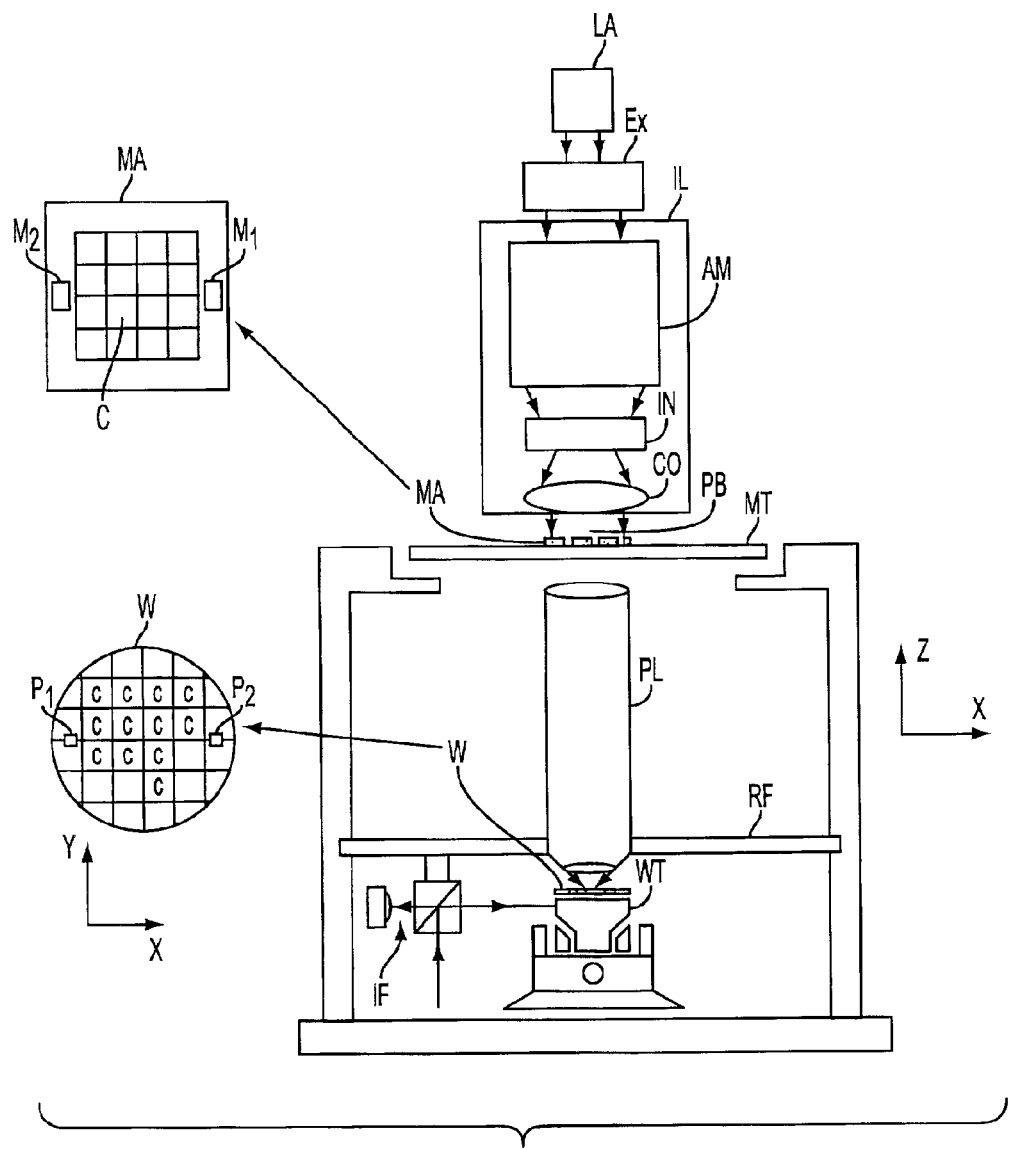
FIG. 23 illustrates an exemplary lithographic projection apparatus.

FIG. 23 schematically depicts a lithographic projection apparatus suitable for use with a mask designed with the aid of the current invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive, catoptric or catadioptric optical system) for imaging an irradiated portion of the mask MA onto a target portion C (e.g. comprising one or more dies) of the substrate W.

As depicted herein, the apparatus is of a transmissive type (i.e. has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g. a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 23 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g. based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 23. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Although certain specific embodiments of the present invention have been disclosed, it is noted that the present invention may be embodied in other forms without departing from the spirit or essential characteristics thereof. The present embodiments are therefore to be considered in all respects as illustrative and not restrictive, the scope of the invention being indicated by the appended claims, and all changes that come within the meaning and range of equivalency of the claims are therefore intended to be embraced therein.

We claim:

1. A method of transferring a lithographic pattern from a photography mask onto a substrate by use of a lithographic exposure apparatus, said method comprising the steps of:
    forming a plurality of resolvable features to be printed on said substrate; and
    forming at least one non-resolvable optical proximity correction feature, said at least one non-resolvable optical proximity correction feature being a phase-edge,
    wherein said at least one non-resolvable phase-edge is the sole optical proximity correction feature positioned between a first resolvable feature and a second resolvable feature.

2. The method of claim 1, wherein said phase-edge has a width dimension substantially equal to zero.

3. The method of claim 1, wherein said phase-edge effects a phase-shift of greater than 0°.

4. The method of claim 1, wherein said phase-edge effects a phase-shift of 180°.

5. The method of claim 1, wherein said mask is illuminated utilizing off-axis illumination.

6. A device manufacturing method comprising the steps of:
    (a) providing a substrate that is at least partially covered by a layer of radiation-sensitive material;
    (b) providing a projection beam of radiation using a radiation system;
    (c) using a pattern on a mask to endow the projection beam with a pattern in its cross-section;
    (d) projecting the patterned beam of radiation onto a target portion of the layer of radiation-sensitive material,
    wherein, in step (c), use is made of a mask comprising:
        a plurality of resolvable features to be printed on said substrate; and
        at least one non-resolvable optical proximity correction feature, said at least one non-resolvable optical proximity correction feature being a phase-edge;
        wherein said at least one non-resolvable phase-edge is the sole optical proximity correction feature positioned between a first resolvable feature and a second resolvable feature.

7. The method of claim 1, wherein said mask comprises a quartz substrate, said at least one non-resolvable phase-edge being formed by etching said quartz substrate.

8. The method of claim 1, wherein said mask forms a chromeless phase-shift mask.

9. The method of claim 1, wherein said non-resolvable feature is spaced apart from said given one of said resolvable features so as to maximize the depth of focus of an imaging system for a given feature size.

10. The method of claim 1, wherein the phase-shift effected by said phase-edge is selected so as to maintain said phase-edge sub-resolution.

11. The device manufacturing method of claim 6, wherein said phase-edge has a width dimension substantially equal to zero.

12. The device manufacturing method of claim 6, wherein said phase-edge effects a phase-shift of greater than 0°.

13. The device manufacturing method of claim 6, wherein said phase-edge effects a phase-shift of 180°.

14. The device manufacturing method of claim 6, wherein said mask forms a chromeless phase-shift mask.

15. The device manufacturing method of claim 6, wherein said non-resolvable feature is spaced apart from said given one of said resolvable features so as to maximize the depth of focus of an imaging system for a given feature size.

16. The device manufacturing method of claim 6, wherein the phase-shift effected by said phase-edge is selected so as to maintain said phase-edge sub-resolution.

17. The device manufacturing method of claim 6, wherein said mask is illuminated utilizing off-axis illumination.

18. The device manufacturing method of claim 6, wherein said mask comprises a quartz substrate, said at least one non-resolvable phase-edge being formed by etching said quartz substrate.

* * * * *